(12) United States Patent
Richter et al.

(10) Patent No.: US 9,076,815 B2
(45) Date of Patent: Jul. 7, 2015

(54) SPACER STRESS RELAXATION

(71) Applicant: GLOBALFOUNDRIES Inc., Grand Cayman (KY)

(72) Inventors: Ralf Richter, Radebeul (DE); Stefan Flachowsky, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 53 days.

(21) Appl. No.: 13/907,362

(22) Filed: May 31, 2013

(65) Prior Publication Data

US 2014/0357042 A1   Dec. 4, 2014

(51) Int. Cl.
*H01L 29/66* (2006.01)
*H01L 21/28* (2006.01)
*H01L 21/266* (2006.01)
*H01L 21/8238* (2006.01)

(52) U.S. Cl.
CPC .......... *H01L 29/6653* (2013.01); *H01L 21/266* (2013.01); *H01L 21/28008* (2013.01); *H01L 29/66568* (2013.01); *H01L 21/823864* (2013.01); *H01L 29/6656* (2013.01); *H01L 29/665* (2013.01)

(58) Field of Classification Search
CPC ................... H01L 21/823864; H01L 29/665; H01L 29/6656
See application file for complete search history.

(56) References Cited

U.S. PATENT DOCUMENTS

| | | | |
|---|---|---|---|
| 2005/0020022 A1* | 1/2005 | Grudowski | 438/305 |
| 2007/0267678 A1* | 11/2007 | Lo | 257/314 |
| 2009/0246927 A1* | 10/2009 | Wiatr et al. | 438/305 |
| 2010/0289093 A1* | 11/2010 | Yang et al. | 257/408 |
| 2011/0042729 A1* | 2/2011 | Chen et al. | 257/288 |
| 2012/0056245 A1* | 3/2012 | Kang et al. | 257/192 |
| 2012/0326246 A1* | 12/2012 | Iwasaki et al. | 257/411 |

* cited by examiner

*Primary Examiner* — Angel Roman
(74) *Attorney, Agent, or Firm* — Amerson Law Firm, PLLC

(57) ABSTRACT

A known problem when manufacturing transistors is the stress undesirably introduced by the spacers into the transistor channel region. In order to solve this problem, the present invention proposes an ion implantation aimed at relaxing the stress of the spacer materials. The relax implantation is performed after the spacer has been completely formed. The relax implantation may be performed after a silicidation process or after an implantation step in the source and drain regions followed by an activation annealing and before performing the silicidation process.

8 Claims, 17 Drawing Sheets

SPACER STRESS RELAXATION

BACKGROUND OF THE INVENTION

1. Field of the Invention

Generally, the present disclosure relates to integrated circuits, and, more particularly, to transistors comprising a gate on whose sides a spacer structure is formed, wherein the spacer structure experiences a certain degree of internal stress.

2. Description of the Related Art

The ongoing trend in electronics towards more and more complex integrated circuits requires the dimensions of electronic devices to decrease, in order to achieve a higher and higher integration density.

Transistors are the dominant circuit elements in current integrated circuits. Currently, several hundred millions of transistors may be provided in presently available complex integrated circuits such as microprocessors, CPUs, storage chips and the like. It is then crucial that the typical dimensions of the transistors included in an integrated circuit have as small as possible typical dimensions, so as to enable a high integration density.

Among the various fabrication technologies of integrated circuits, the CMOS technology is currently the most promising approach, since it enables producing devices with superior characteristics in terms of operating speed, power consumption and cost efficiency. In CMOS circuits, complementary transistors, i.e., P-channel transistors and N-channel transistors, are used for forming circuit elements, such as inverters and other logic gates to design highly complex circuit assemblies. During the fabrication of complex integrated circuits using CMOS technology, millions of transistors, i.e., N-channel transistors and P-channel transistors, are formed in active regions defined within a semiconductor layer supported by a substrate.

Presently, the layer in which most integrated circuits are formed is made out of silicon, which may be provided in crystalline, polycrystalline or amorphous form. Other materials, such as, for example, dopant atoms or ions, may be introduced into the original semiconductor layer.

A MOS transistor or generally a field effect transistor, irrespective of whether an N-channel transistor or a P-channel transistor is considered, comprises a source and a drain region, highly doped with dopants of the same species. An inversely or weakly doped channel region is then arranged between the drain and the source regions. The conductivity of the channel region, i.e., the drive current capability of the conductive channel, may be controlled by a gate electrode formed in the vicinity of the channel region and separated therefrom by a thin insulating layer. The conductivity of the channel region depends on, among other things, the mobility of the charge carriers and on the distance along the transistor width direction between the source and drain regions, which is also referred to as channel length. For example, by reducing the channel length, the channel resistivity decreases. Thus, an increased switching speed and higher drive current capabilities of a transistor may be achieved by decreasing the transistor channel length.

However, reduction of transistor channel length may not be pushed to extreme limits without incurring other problems. For example, the capacitance between the gate electrode and the channel decreases with decreasing channel length. This effect must then be compensated for by reducing the thickness of the insulating layer between the gate and the channel. For example, for a gate length of approximately 80 nm, a gate dielectric material based on silicon dioxide with a thickness of less than 2 nm may be required in high speed transistor elements. Such small thicknesses of the insulating layer might, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, other alternatives have been developed in order to increase the charge carrier mobility in the channel region, thereby also enhancing overall performance of field effect transistors.

One promising approach in this respect is the generation of a certain type of strain in the channel region, since the charge carrier mobility in silicon strongly depends on the strain conditions of the crystalline material. For example, it has been found that, for a standard crystallographic configuration of the silicon-based channel region, a compressive strain component in a P-channel transistor may result in a superior mobility of holes, thereby increasing switching speed and drive current of P-channel transistors. On the other hand, evidence has shown that a tensile stress component in an N-channel transistor region may increase the mobility of electrons, thus improving the transistor performance.

Therefore, attempts have been made in the past decades to improve transistor performance by introducing a stress-inducing material in or near the channel region of silicon-based transistors. Stress can be brought about by the difference in lattice constant between the stress-inducing material and silicon. For instance, in order to induce a compressive stress in the channel region of a P-channel transistor, a material with a slightly larger lattice constant than silicon, such as a silicon/germanium semiconductor alloy, may be epitaxially grown in the transistor active region next to or on top of the channel region. If, on the other hand, a tensile stress is to be induced on the channel region of an N-channel transistor, a material with a slightly smaller lattice constant than silicon, such as silicon carbide, may be epitaxially formed next to or on top of the channel region.

In general, desired stress conditions within the channel region of a transistor element may be achieved by modifying the internal stress characteristic of a material which is closely positioned to the transistor structure, so as to efficiently transfer the internal stress of the material to the channel region.

A widely used approach relies, for example, on an etch stop layer formed on the surface of the basic transistor structure. This etch stop layer, which may comprise a material such as silicon nitride, is typically affected by a certain degree of internal stress. Techniques have been developed in order to adjust the internal stress level in the etch stop layer so as to position an etch stop layer having an internal compressive strain above a P-channel transistor and an etch stop layer having an internal tensile strain above an N-channel transistor.

A semiconductor fabrication method which enables incorporating both tensile and compressively stressed layers into a single CMOS device is called the "dual stress liner" approach. In this process, a first silicon nitride ($Si_3N_4$) etch stop layer with an intrinsic tensile stress level of 1 Giga Pascal (GPa) or higher is uniformly deposited over the device surface. The first film is then patterned and etched from the regions including P-channel transistors. Subsequently, a second silicon nitride etch stop layer with an intrinsic compressive stress level of 2 GPa or higher is deposited on the device surface. Finally, the compressive layer is patterned and etched from the device areas including an N-channel transistor. The first and second stressed layers are generally formed by using well-established plasma enhanced chemical vapor deposition (PECVD) techniques wherein process parameters, such as ion bombardment, pressure, composition of precursor gases and the like, are appropriately selected so as to deposit a material with the desired degree of internal stress.

Additional stress in the channel region of a transistor is introduced by the presence of the spacers typically provided at sidewalls of the gate electrode. Spacers are normally used as implantation masks when defining the source and drain regions of transistors. However, due to their proximity to the channel region, spacers may also transfer to the transistor channel region the internal stress of the material of which they are comprised.

In the following, the fabrication method of a semiconductor structure according to the state of the art will be reviewed with reference to FIGS. 1a-1d.

FIG. 1a schematically shows a cross-sectional view of a semiconductor structure 100 in an advanced manufacturing stage included in front-end-of-the-line processing. As shown in FIG. 1a, the device 100 comprises a substrate 101, such as a semiconductor material and the like, above which a semiconductor layer 102 is formed. The semiconductor layer 102 is typically made of a silicon single crystal. The semiconductor layer 102 is laterally divided into a plurality of active regions 102a, which are to be understood as semiconductor regions in and above which one or more transistors are to be formed. For convenience, a single active region 102a is illustrated, which is laterally delimited by an isolation region 102b, such as a shallow trench isolation. Depending on the overall device requirements, the substrate 101 and the semiconductor layer 102, for instance initially provided as a silicon material, may form a silicon-on-insulator (SOI) architecture when a buried insulating material (not shown) is formed directly below the semiconductor layer 102. In other cases, initially the semiconductor layer 102 represents a part of the crystalline material of the substrate 101 when a bulk configuration is to be used for the device 100.

The semiconductor structure 100 includes a transistor 150 formed in and above the active region 102a. The transistor 150 may be a P-channel FET (field effect transistor) or an N-channel FET.

FIG. 1a shows the transistor 150 after a gate electrode structure 160 has been formed on the active region 102a of the semiconductor layer 102. The gate electrode 160 may have any appropriate geometric configuration, for instance in terms of length and width. For example, the gate length, i.e., in FIG. 1a, the horizontal extension of an electrode material 162 of the gate electrode structure 160, may be 50 nm and less. An insulation layer 161 physically and electrically separates the gate electrode material 162 from the transistor channel region 155 to be formed in the active region 102a.

Depending on the configuration of the gate electrode structure 160, the insulation layer 161 and the gate electrode material 162 may be formed in different ways. For example, if the gate electrode 160 is a conventional oxide/polysilicon gate electrode (polySiON), then the gate insulation layer 161 may be formed from a conventional gate dielectric material, such as, for example, silicon dioxide, silicon oxynitride and the like, whereas the gate electrode material 162 may comprise polysilicon. Alternatively, a high-k dielectric/metal gate electrode (HKMG) configuration may be preferred for the gate electrode structure 160. In this case, the insulation layer 161 may be one of the high-k gate dielectric materials well known in the art. By high-k material, it is referred to a material with a dielectric constant "k" higher than 10. Examples of high-k materials used as insulating layers in gate electrodes are tantalum oxide ($Ta_2O_5$), strontium titanium oxide (Sr-$TiO_3$), hafnium oxide ($HfO_2$), hafnium silicon oxide (HfSiO), zirconium oxide ($ZrO_2$) and the like.

The gate electrode structure 160 may also comprise a gate metal layer 162a, for instance in the form of tantalum nitride and the like, possibly in combination with a work function metal species, such as aluminum and the like. The gate metal layer 162a is typically formed above the insulation layer 161, thereby adjusting an appropriate work function and thus threshold voltage of the transistor 150.

The gate electrode structure 160 may be laterally delimited by a spacer structure 163, which may comprise one or more dielectric materials, such as, for example, silicon nitride, silicon dioxide, silicon oxynitride and the like. For example, the structure 163 may comprise appropriate protective liner materials for laterally encapsulating sensitive gate materials, such as the insulation layer 161 and, in particular, the metal layer 162a.

In the configuration shown in FIG. 1a, the spacer structure 163 comprises a first spacer element 163sp0 formed on and in contact with the sidewalls of the gate electrode structure 160. The first spacer element 163sp0 may comprise a first spacer material such as, for example, silicon nitride. The spacer structure 163 also comprises a liner layer 1631 formed on the first spacer element 163sp0. The liner layer 1631 typically comprises a dielectric material such as, for example, silicon dioxide. Finally, the spacer structure 163 also comprises a second spacer element 163sp1 formed onto the liner layer 1631. Typically, the second spacer element 163sp1 comprises a dielectric material such as silicon nitride, analogously to the first spacer element 163sp0.

The transistor 150 formed in the semiconductor structure 100 also comprises source and drain regions 151, which are highly doped regions defined in the active region 102a. The source and drain regions 151 comprise extension regions 151e, situated in proximity to the gate structure 160 and defining the length of the channel region 155. Furthermore, the source and drain regions 151 comprise deep regions 151d, which are situated further from the gate structure 160 with respect to extension regions 151e.

Extension regions 151e and deep regions 151d are typically defined by implanting doping ions of the desired species and at the desired concentration. The spacer structure 163 may be advantageously shaped so as to act as an implantation mask during the implantation steps performed in order to define the source and drain regions 151. More specifically, the first spacer element 163sp0 may be used so as to define the extension regions 151e during a first implantation step. Subsequently, after forming the liner layer 1631 and the second spacer element 163sp1, a second implantation step may be performed so as to define deep regions 151d, while using the second spacer element 163sp1 as an implantation mask.

In a stage of the fabrication process flow subsequent to that shown in FIG. 1a, a refractory metal layer (not shown) is deposited onto the exposed face of the semiconductor structure 100 using a suitable material deposition process, such as chemical vapor deposition (CVD), physical vapor deposition (PVD) and the like. The refractory metal layer may comprise one or more refractory metals which are adapted to form a metal silicide layer in correspondence to portions of the semiconductor structure face exposing the gate electrode material 162 and source or drain regions 151. Thus, the refractory metal layer may comprise, for example, one metal, such as nickel, titanium, cobalt and the like. Preferably, the refractory metal layer comprises nickel. The refractory metal layer may also comprise platinum in addition to nickel. Platinum, when added to nickel, may, in some cases, promote a more homogeneous formation of nickel monosilicide.

After deposition of the refractory metal layer, a heat treatment process may be performed so as to initiate a chemical reaction between the nickel atoms in the layer and the silicon atoms in those areas of the source and drain regions 151 and the gate electrode material 162 that are in contact with the nickel, thereby forming nickel silicide regions that substantially comprise low-resistivity nickel monosilicide. The heat treatment process is generally a two-step process. A first heat treatment step is performed in the range of approximately 300-400° C. for a time period of approximately 30-90 seconds. After the first heat treatment step, any non-reacted nickel material from the refractory metal layer is selectively removed by one of a variety of well-known etch/cleaning processes. Finally, a second heat treatment step is performed in the range of approximately 400-500° C., again for a time period of approximately 30-90 seconds. It should be noted that the silicon material contained in the sidewall spacer structures 163 and the isolation regions 102b does not substantially take part in the chemical reaction induced during the heat treatment process, as it is present in those features only as a thermally stable silicon dioxide and/or silicon nitride material.

FIG. 1b shows the semiconductor structure 100 in the stage of the fabrication process flow subsequent to the deposition of the refractory metal layer and application of the heat treatment. As a result of the heat treatment, a metal silicide layer 162b has formed partly in and partly on top of the upper surface of the gate electrode material 162, exposed before depositing the refractory metal layer. Analogously, a metal silicide layer 153 has formed partly in and partly on top of the portion of the semiconductor layer 102 exposed before depositing the refractory metal layer.

FIG. 1c shows that, after formation of metal silicide layers, preferably nickel silicide layers 162b and 153, a stressed material layer 120 is deposited on the exposed face of the semiconductor structure 100 by using a well-known deposition technique such as, for example, PECVD. For example, the deposition of the stressed material layer 120 may be performed under a pressure that is in the range of 300-1200 mTorr, at a temperature between 400-500° C.

The stressed material layer 120 comprises a dielectric material, typically silicon nitride, having an etch selectivity to a dielectric material layer 130 formed above the semiconductor structure 100 during a later manufacturing stage (see, e.g., FIG. 1d). Thus, the stressed material layer 120 acts also as an etch stop layer.

The stressed material layer 120 may comprise two or more internally stressed layers, separated by intermediate liner layers where necessary. For example, the stressed material layer 120 may comprise a silicon nitride layer having an intrinsic tensile stress in correspondence to N-channel transistors and a silicon nitride layer having an intrinsic compressive stress in correspondence to P-channel transistors, as obtained, for example, by following the dual-stress-liner approach.

FIG. 1d schematically illustrates a fabrication process step subsequent to that shown in FIG. 1c. An interlayer dielectric material layer 130 is deposited on the stressed material layer 120. The dielectric layer 130, which may comprise any suitable dielectric material such as, for example, silicon dioxide ($SiO_2$), is generally deposited as a continuous layer. Thereafter, an etching process, such as reactive ion etching (RIE), is performed on the semiconductor structure 100. Etching may be performed after placing an appropriately patterned etching mask 134 on the surface of the structure 100. Etching is performed in order to form via openings 172 and 174 exposing portions of the metal silicide layer 153 contacting the source and drain regions 151 and portions of the metal silicide layer 162b contacting the gate electrode material 162, respectively.

In particular, etching may be performed in two subsequent steps. In the first step, portions of the dielectric layer 130 are removed by using a selective etching not affecting the stressed material layer 120. In the second step of the etching process, the portions of the stressed material layer 120 at the bottom of openings 172 and 174 are removed so as to expose underlying portions of the metal silicide layers 153 and 162b, respectively.

In a subsequent fabrication step not shown in the figures, via openings 172 and 174 are filled with a high electrical conductivity metal, such as tungsten, so as to provide contact points to the source and drain regions 151 and to the gate electrode 160.

For advanced sub-45 nm technology, highly conformal spacer materials are needed that result in deposited film characteristics (e.g., film thickness) substantially uniform across the whole device surface and substantially independent of the transistor gate pitch. By the term "highly conformal film," a film is here intended which, when deposited onto a semiconductor device surface, has a thickness difference of about 5% or smaller for the film portions grown on device areas with larger and smaller transistor gate pitches, respectively. A highly conformal film has ideally a thickness difference among its portions as close as possible to 0%.

The smaller the device features get, the harder it is to achieve uniformity of film characteristics. Thus, forming a highly conformal film to be patterned so as to obtain a spacer structure turns out to be a crucial issue when manufacturing devices in the 32 nm or 28 nm technologies, or beyond.

Typically, spacer materials are initially deposited as continuous films by using a standard growth technique, such as PECVD. As said above, the spacer material may typically comprise a dielectric such as silicon nitride ($Si_3N_4$ or SiN). However, when a silicon nitride film is deposited by using PECVD on the surface of a device produced according to the 32 nm or 28 nm technologies, a thickness difference of about 20% is observed for the portions of the film grown on device areas with larger and smaller transistor gate pitches, respectively. This results in dramatic differences in the device characteristics according to the device area, which causes a considerable yield loss.

Silicon nitride films to be patterned and used as spacer material may be formed by using an improved deposition based on the IRad™ technology. When used in the 28 nm technology, IRad™ nitride films prove nearly uniform in thickness irrespective of the device onto which they are formed and the transistor gate pitch.

However, nitride films grown on semiconductor devices, including IRad™ nitride films, are affected by a considerable tensile stress which can be as high as 1 GPa or more. Although the performance of N-channel transistors may benefit from the tensile stress of the silicon nitride layer of the spacer, tensile stress introduced by the spacer is detrimental for the efficiency of P-channel transistors.

In general, it is desirable to apply a predictable and adjustable level of stress to the channel region of a transistor. Since the stress component introduced by the spacers is hardly controllable, it is desirable to relax or to reduce to as low as possible the intrinsic stress experienced by the material included in the spacers. In this manner, the etch stop layer or layers deposited on the surface of the semiconductor layer may be formed so as to have a predetermined stress level which may be reliably transferred to the transistor channel region.

Thus, an object of the present invention is to provide an improved fabrication method for transistors, in particular for field effect transistors, wherein the internal stress experienced by the materials included in the spacers is relaxed or reduced to a minimum.

In general, the present inventions aim at reducing transistor performance degradation due to internally stressed components formed after gate patterning in areas lying close to the gate.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is based on the inventive idea that the intrinsic stress experienced by a spacer structure formed on the sidewalls of a gate electrode may be relaxed by implanting ions of an appropriate species into the spacer material. According to the present disclosure, the relax implantation step is performed after the spacer structure on the sidewalls of the gate electrode has been fully formed.

According to one embodiment, the implantation step may be performed after removing part of the spacer material. On the basis of these considerations, a method of forming a transistor structure is disclosed which includes forming a gate structure on an active region of a semiconductor layer, forming a spacer structure on the sidewalls of the gate structure, the spacer structure experiencing an internal stress, forming a metal silicide layer forming an interface with the semiconductor layer, removing at least a portion of the spacer structure after forming the metal silicide layer, and performing an ion implantation in order to relax the internal stress experienced by a remaining portion of the spacer structure.

According to a further embodiment, the implantation step may be performed preferably before forming the metal silicide layer. A method of forming a transistor structure is disclosed which includes forming a gate structure on an active region of a semiconductor layer, forming a spacer structure on the sidewalls of the gate structure, the spacer structure experiencing an internal stress, performing an ion implantation in order to relax the internal stress experienced by the spacer structure, and forming a metal silicide layer forming an interface with the semiconductor layer.

According to a particular embodiment, the metal silicide layer is formed after performing the ion implantation in order to relax the internal stress in the spacer structure.

BRIEF DESCRIPTION OF THE DRAWINGS

The disclosure may be understood by reference to the following description taken in conjunction with the accompanying drawings, in which like reference numerals identify like elements, and in which.

Figure 1A:
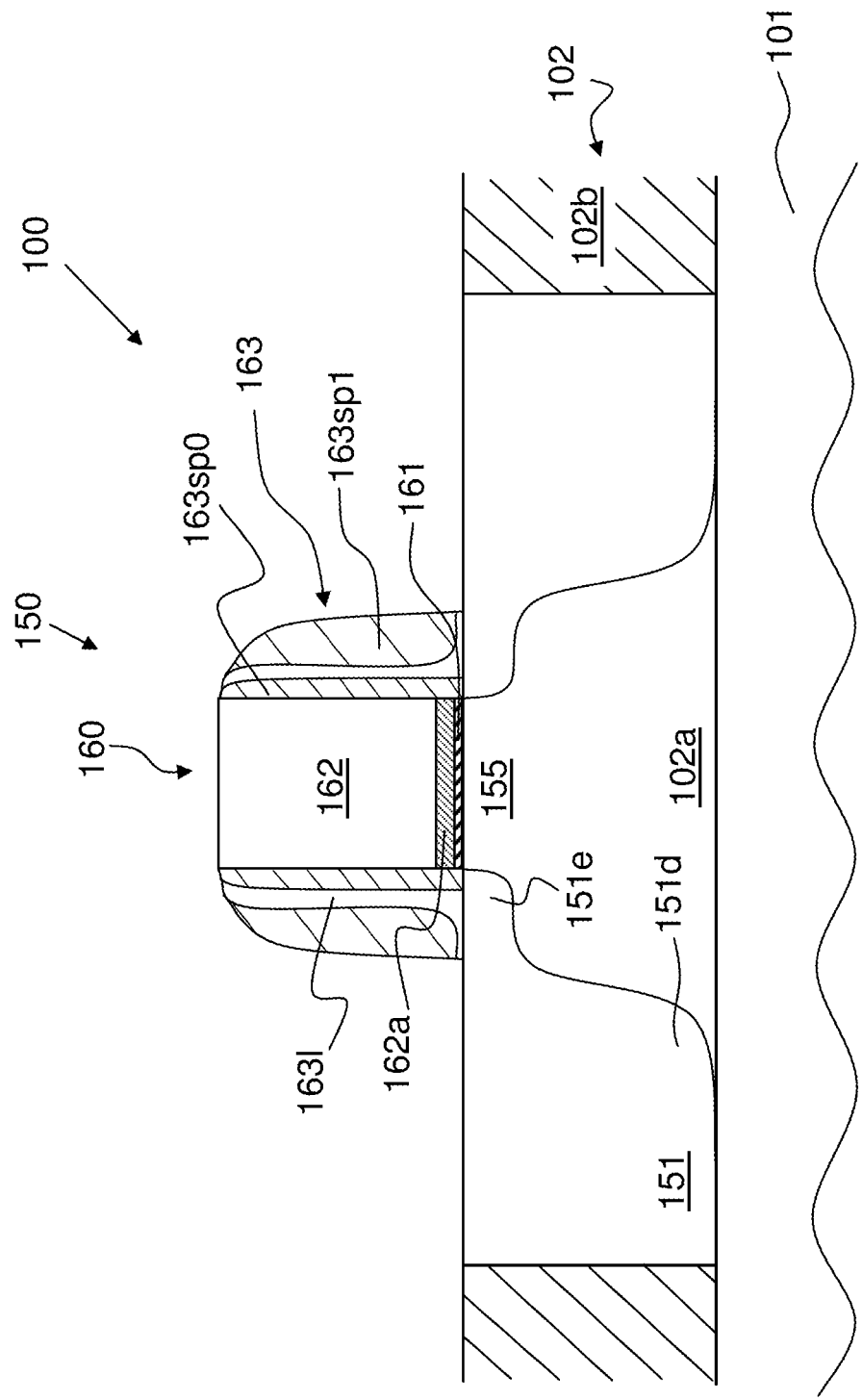
FIGS. 1a-1d schematically illustrate cross-sectional views of a semiconductor structure comprising a transistor during subsequent stages of a fabrication process flow according to the prior art.
Figure 1B:
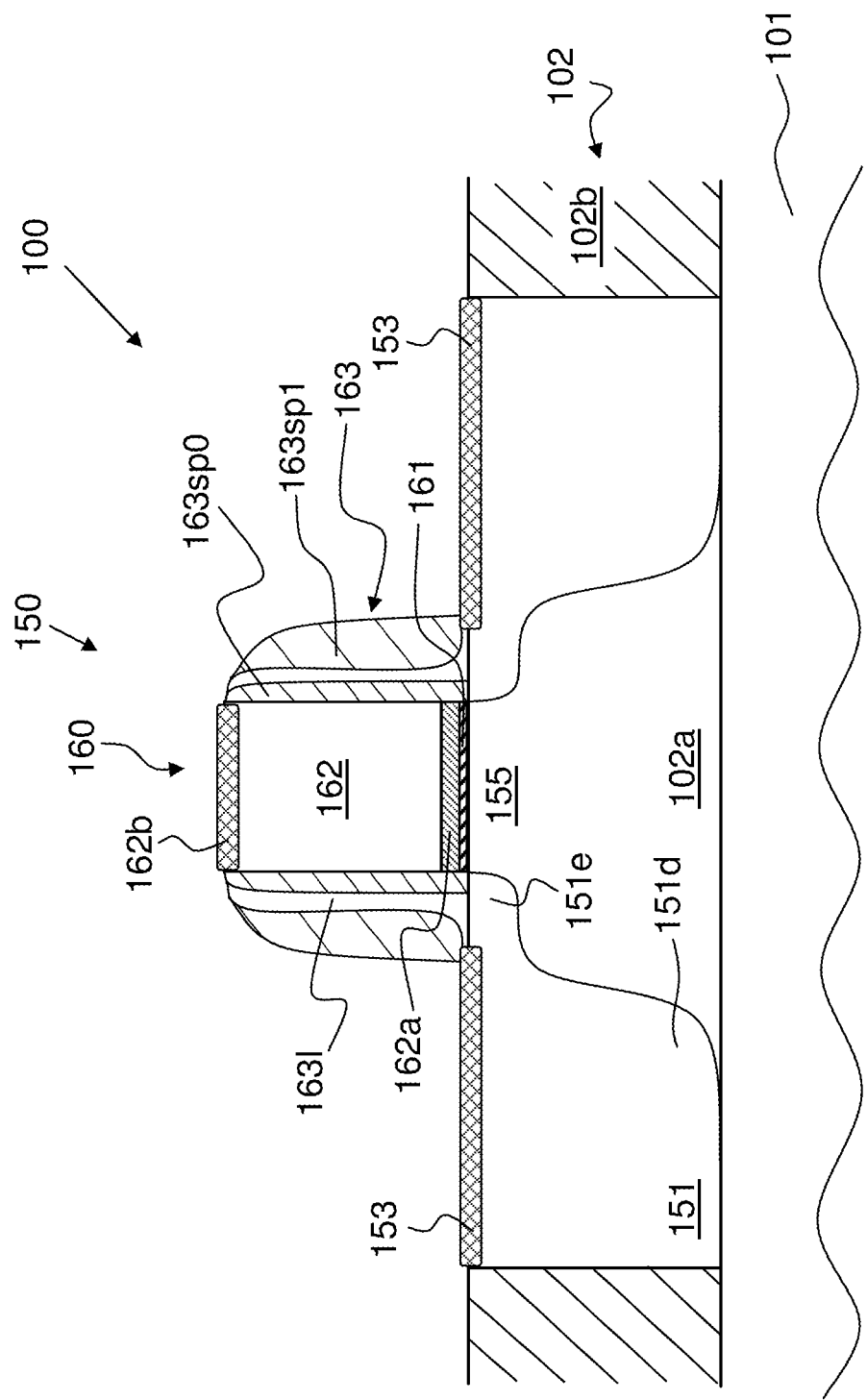
Figure 1C:
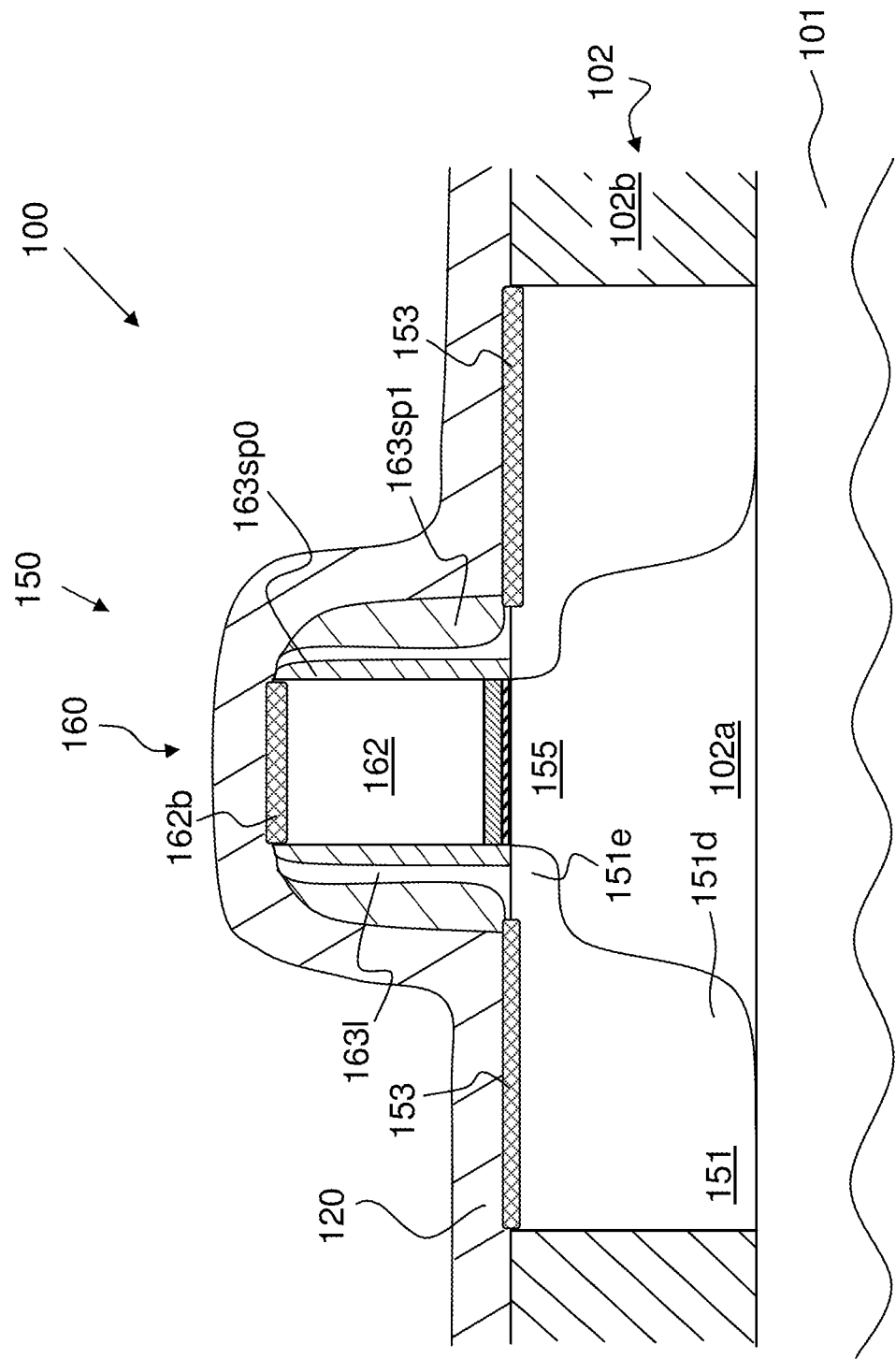

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be noted that, where appropriate, the reference numbers used in describing the various elements illustrated in FIGS. 2a-2i and in FIGS. 3a-3d substantially correspond to the reference numbers used in describing the corresponding elements illustrated in FIGS. 1a-1d above, except that the leading numeral has been changed from a "1" to a "2" in FIGS. 2a-2i, or from a "1" to a "3" in FIGS. 3a-3d. For example, semiconductor device "100" corresponds to semiconductor devices "200" and "300," gate insulation layer "161" corresponds to gate insulation layers "261" and "361," gate electrode "160" corresponds to gate electrodes "260" and "360," and so on. Accordingly, the reference number designations used to identify some elements of the presently disclosed subject matter may be illustrated in FIGS. 2a-2i and/or FIGS. 3a-3d, but may not be specifically described in the following disclosure. In those instances, it should be understood that the numbered elements shown in FIGS. 2a-2i and/or 3a-3d which are not described in detail below substantially correspond with their like-numbered counterparts illustrated in FIGS. 1a-1d and described in the associated disclosure set forth above.

Figure 2A:
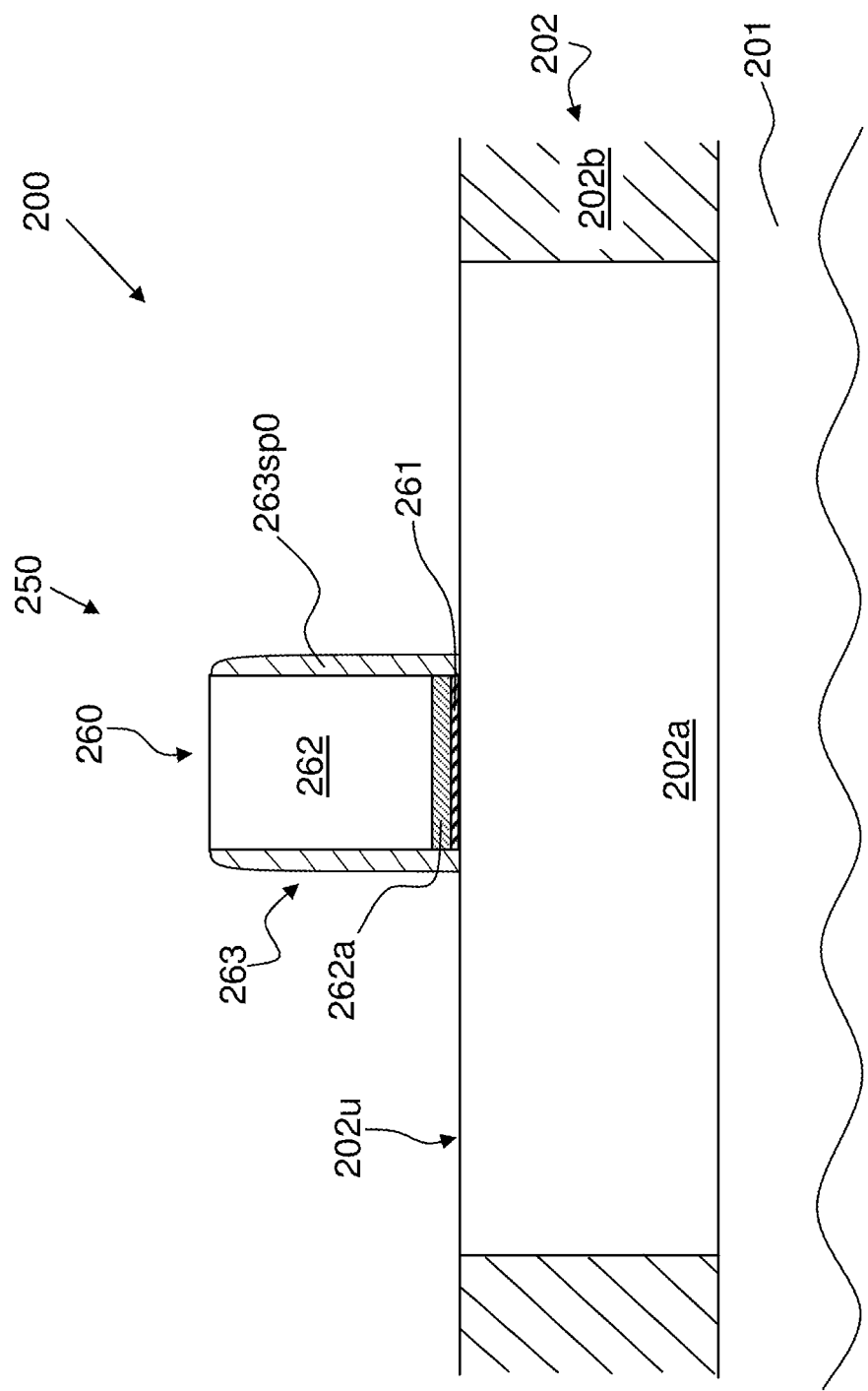
FIGS. 2a-2i schematically illustrate cross-sectional views of a semiconductor structure during subsequent manufacturing stages according to an embodiment of the method according to the present invention.
Figure 2B:
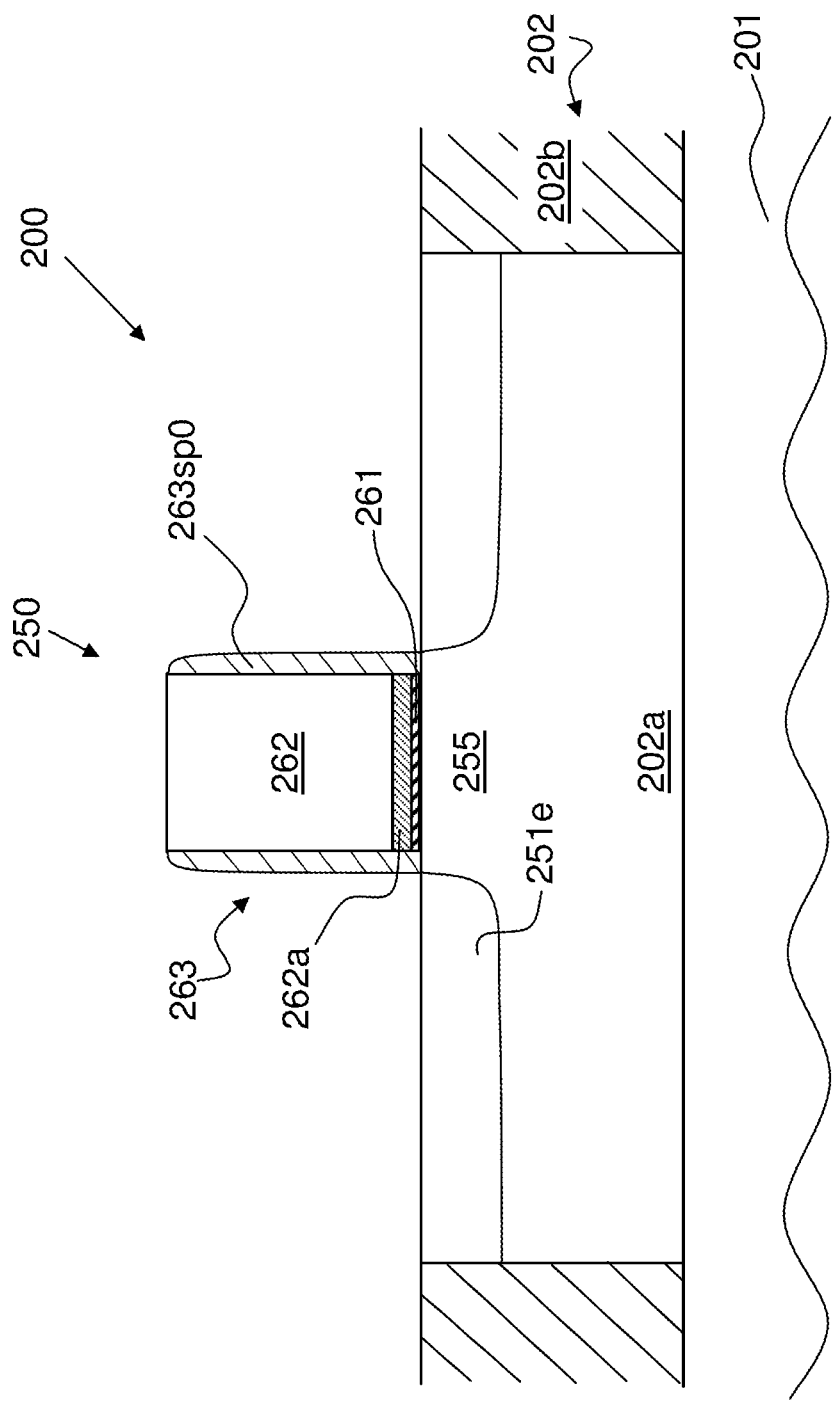
Figure 2C:
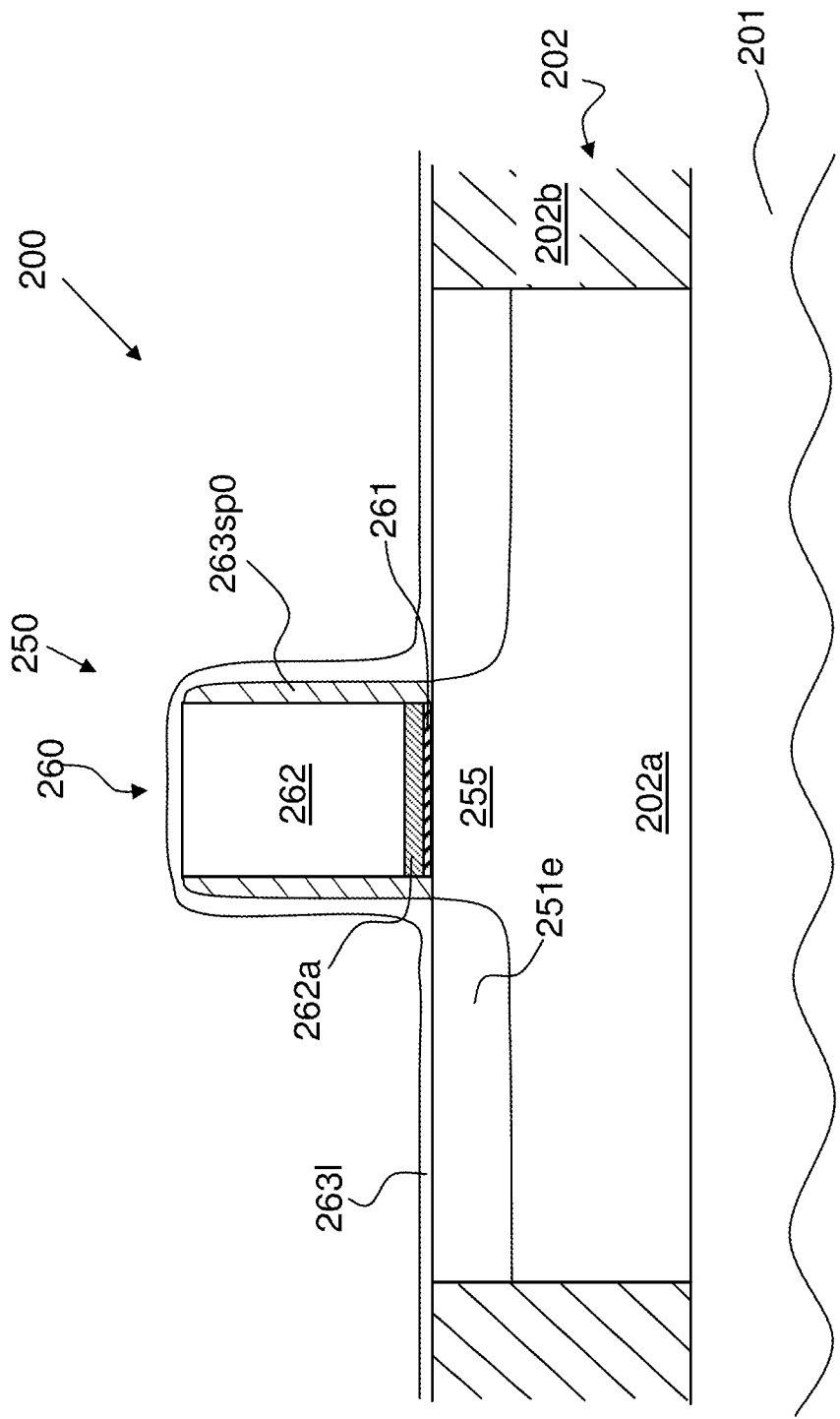
Figure 2D:
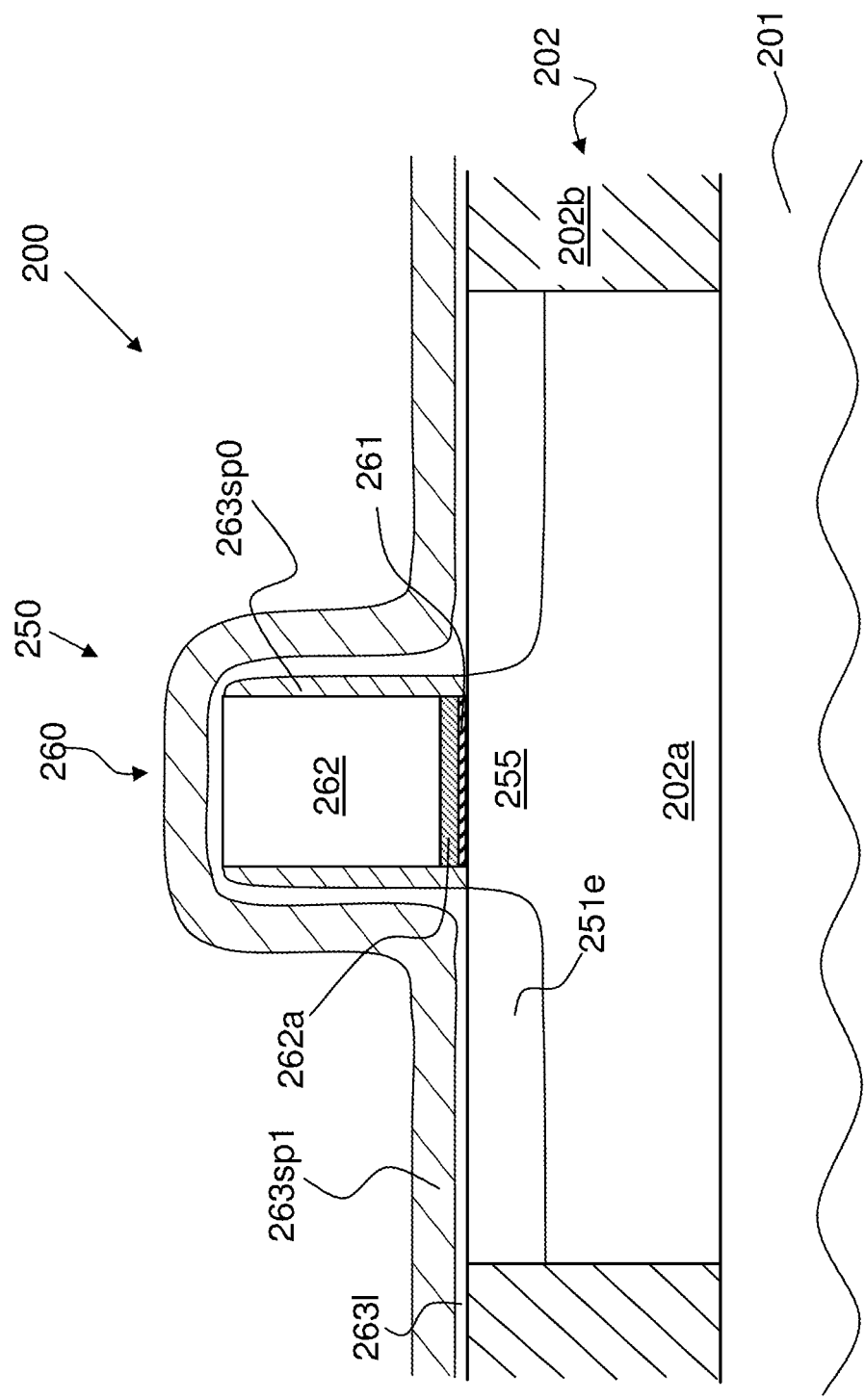
Figure 2E:
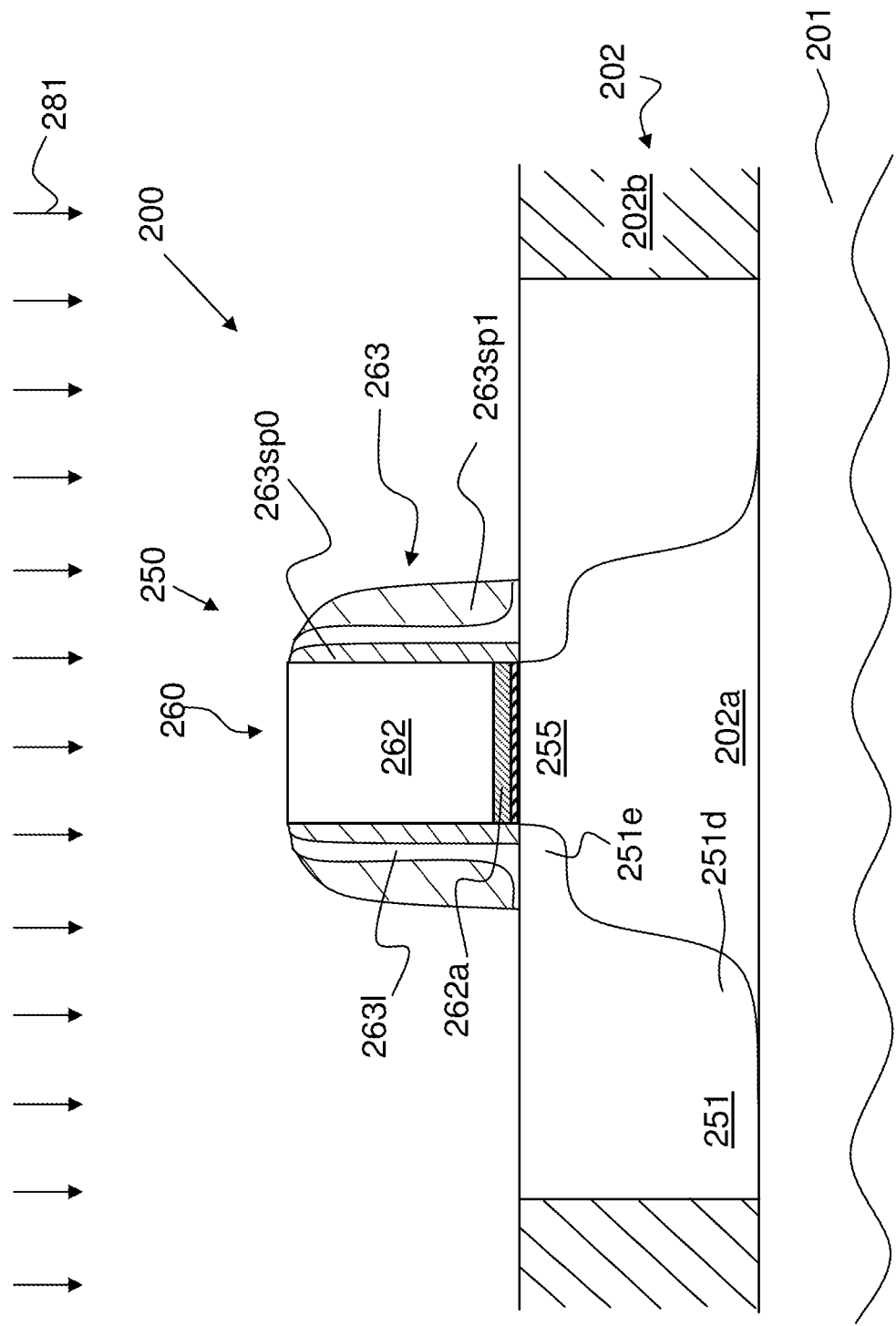
Figure 2F:
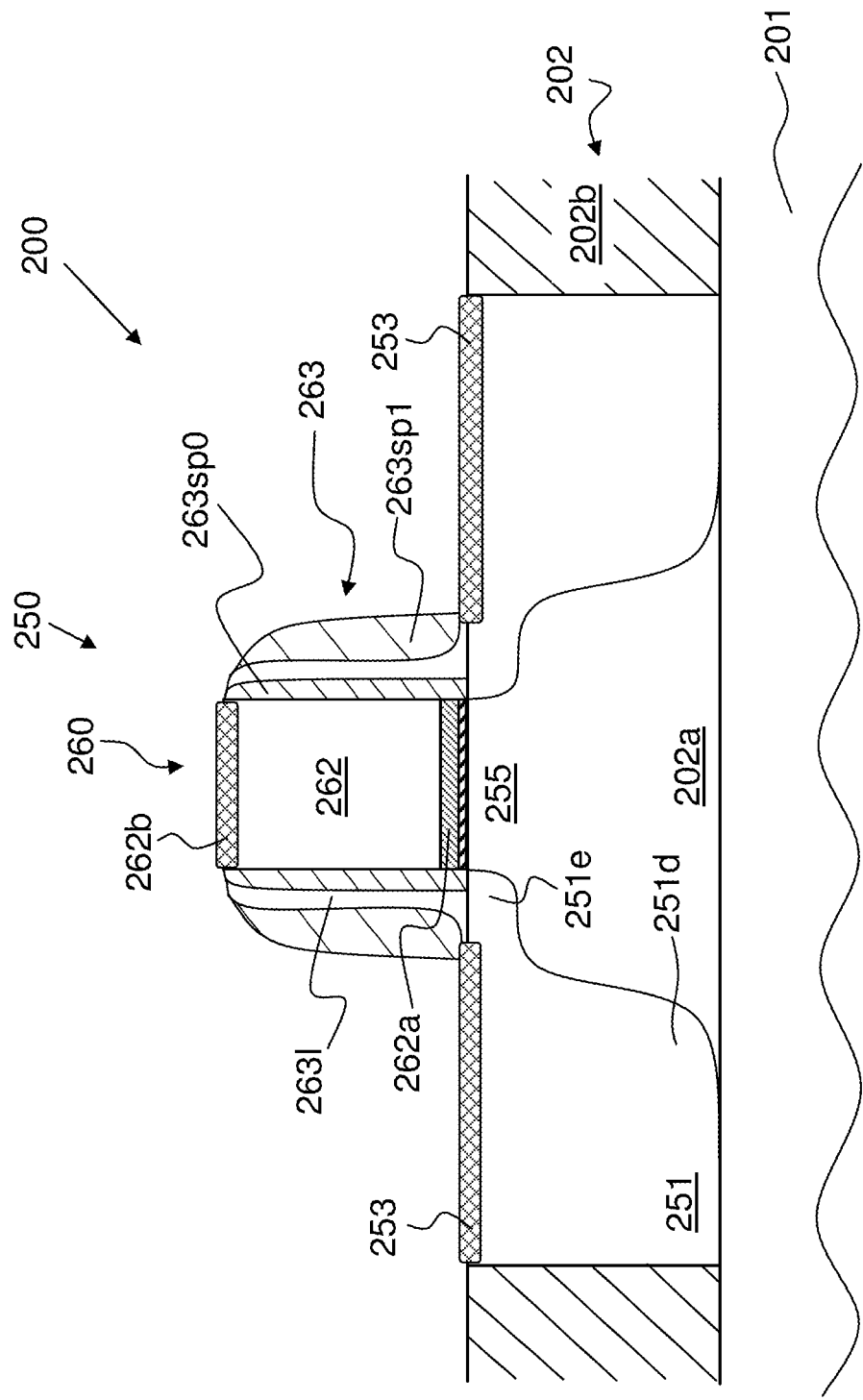
Figure 2G:
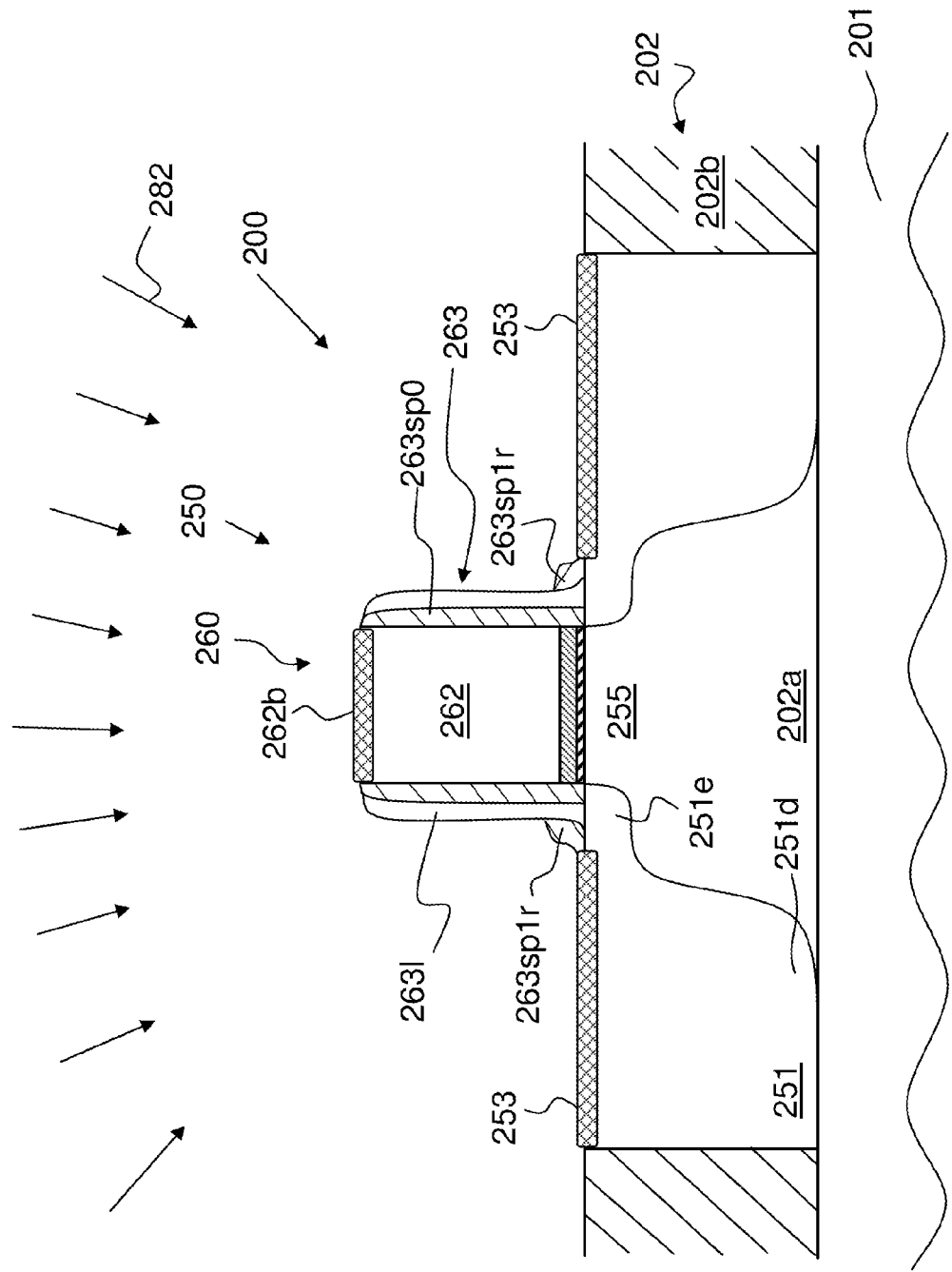
Figure 2H:
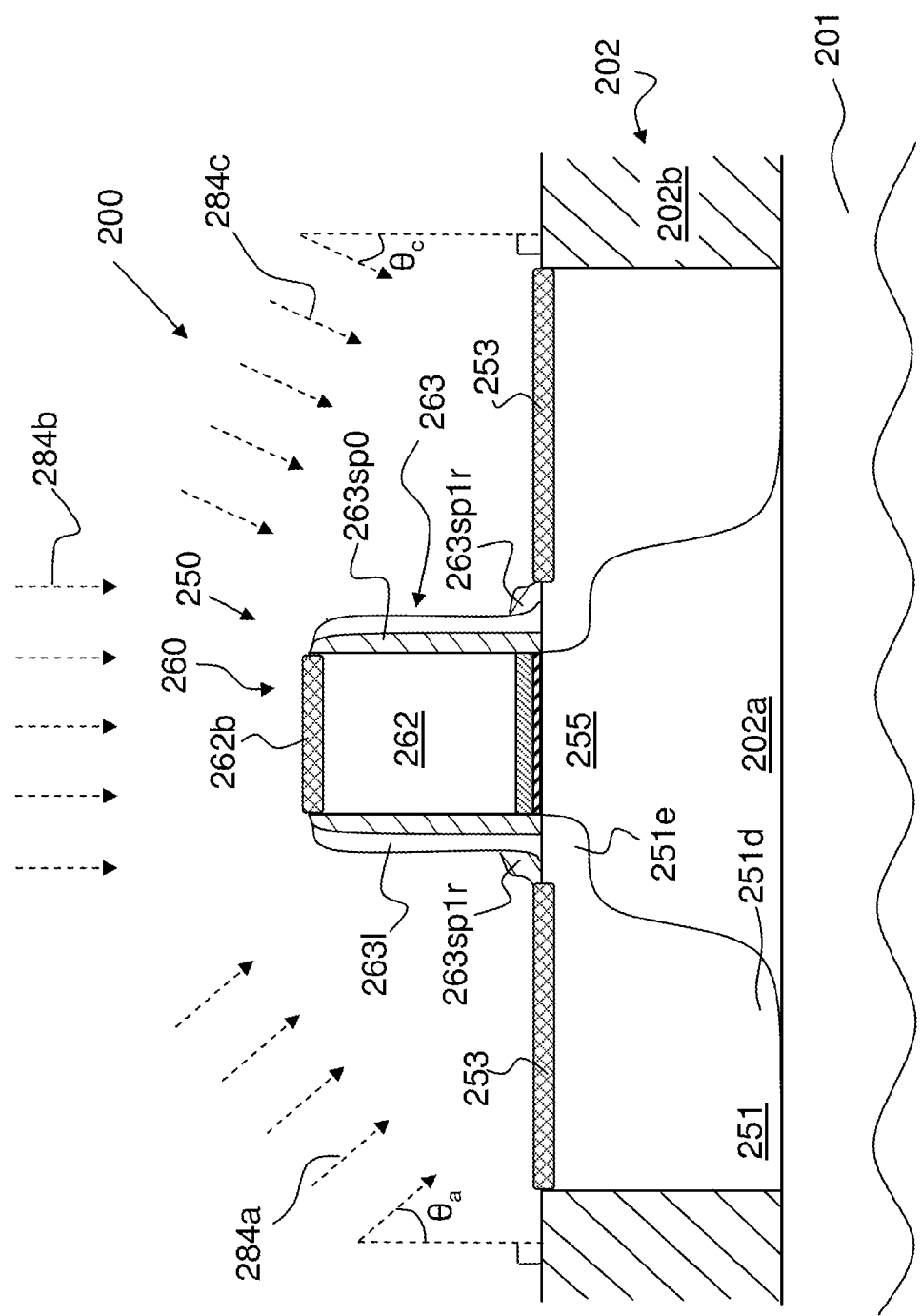
Figure 2I:
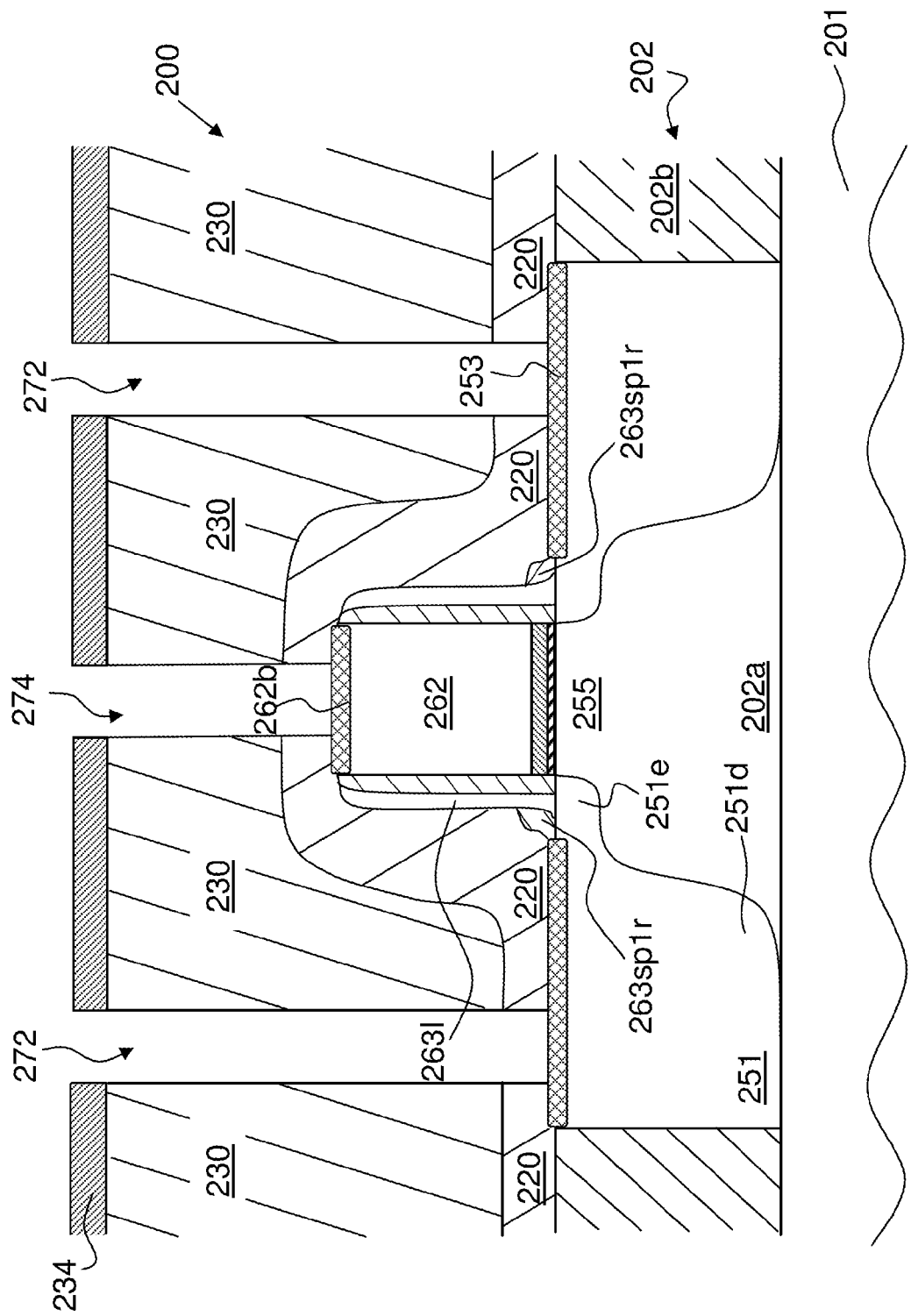
Figure 3A:
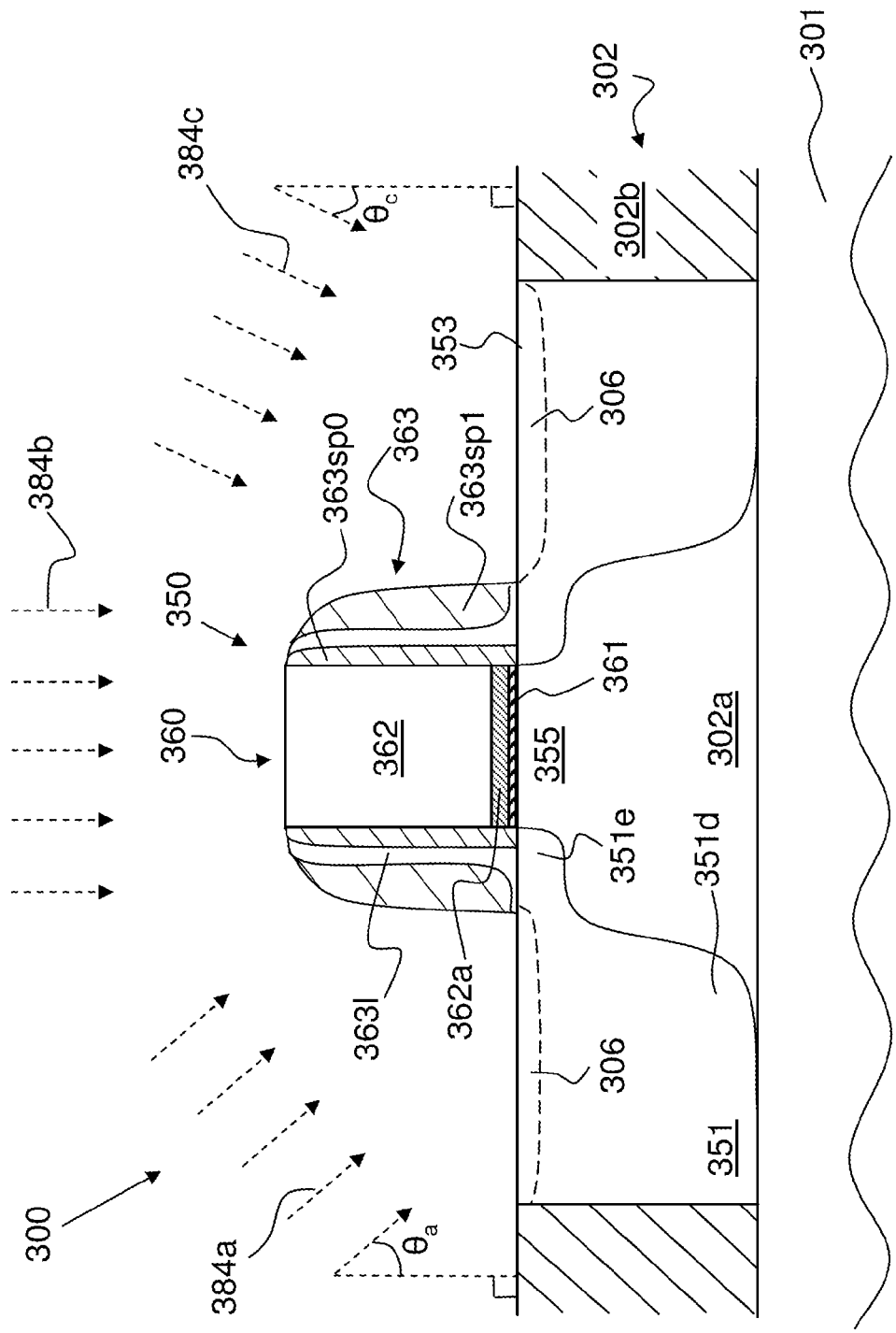
FIGS. 3a-3d schematically illustrate cross-sectional views of a semiconductor structure during subsequent manufacturing stages according to a further embodiment of the method according to the present invention.
Figure 3B:
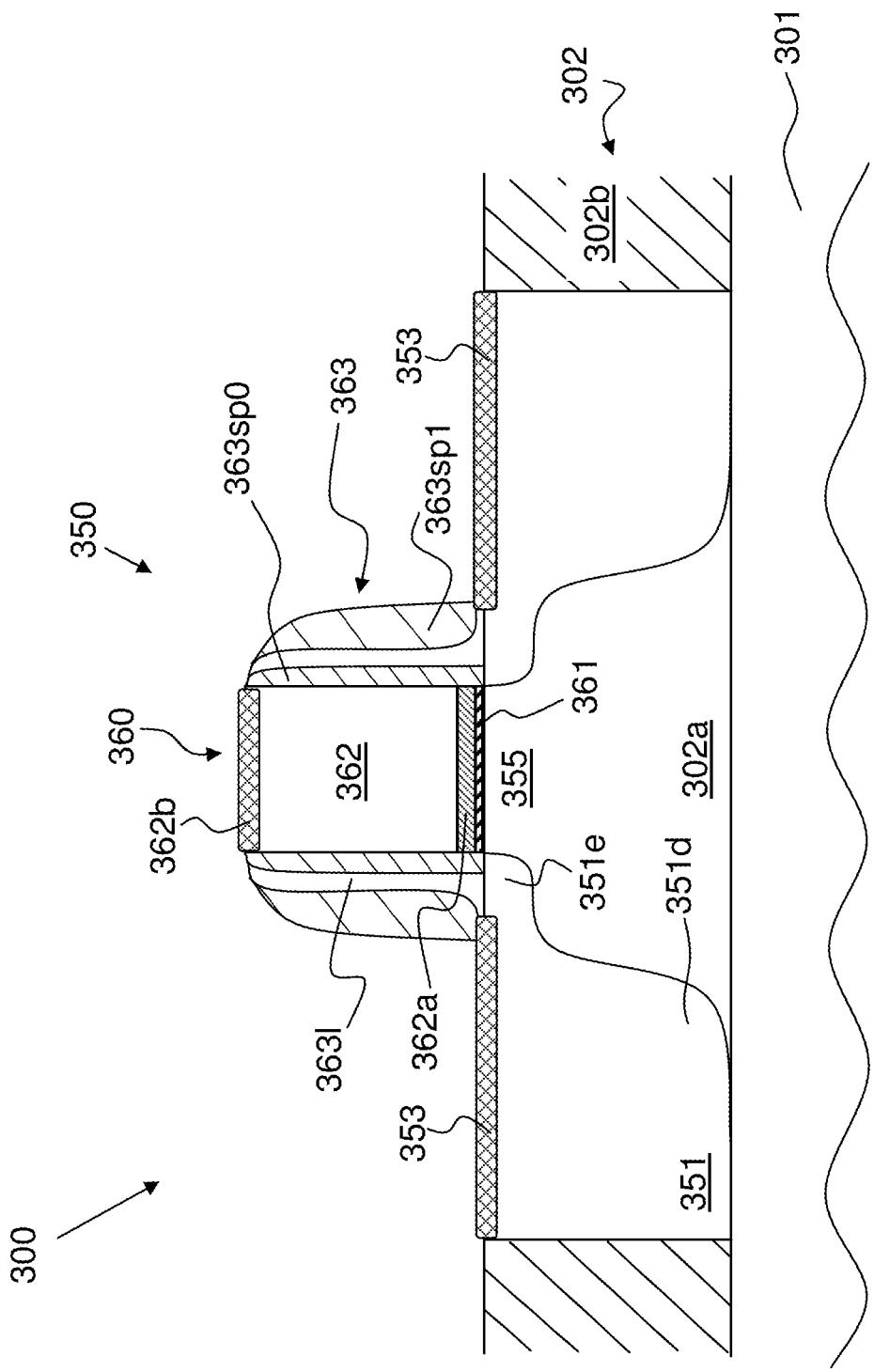
Figure 3C:
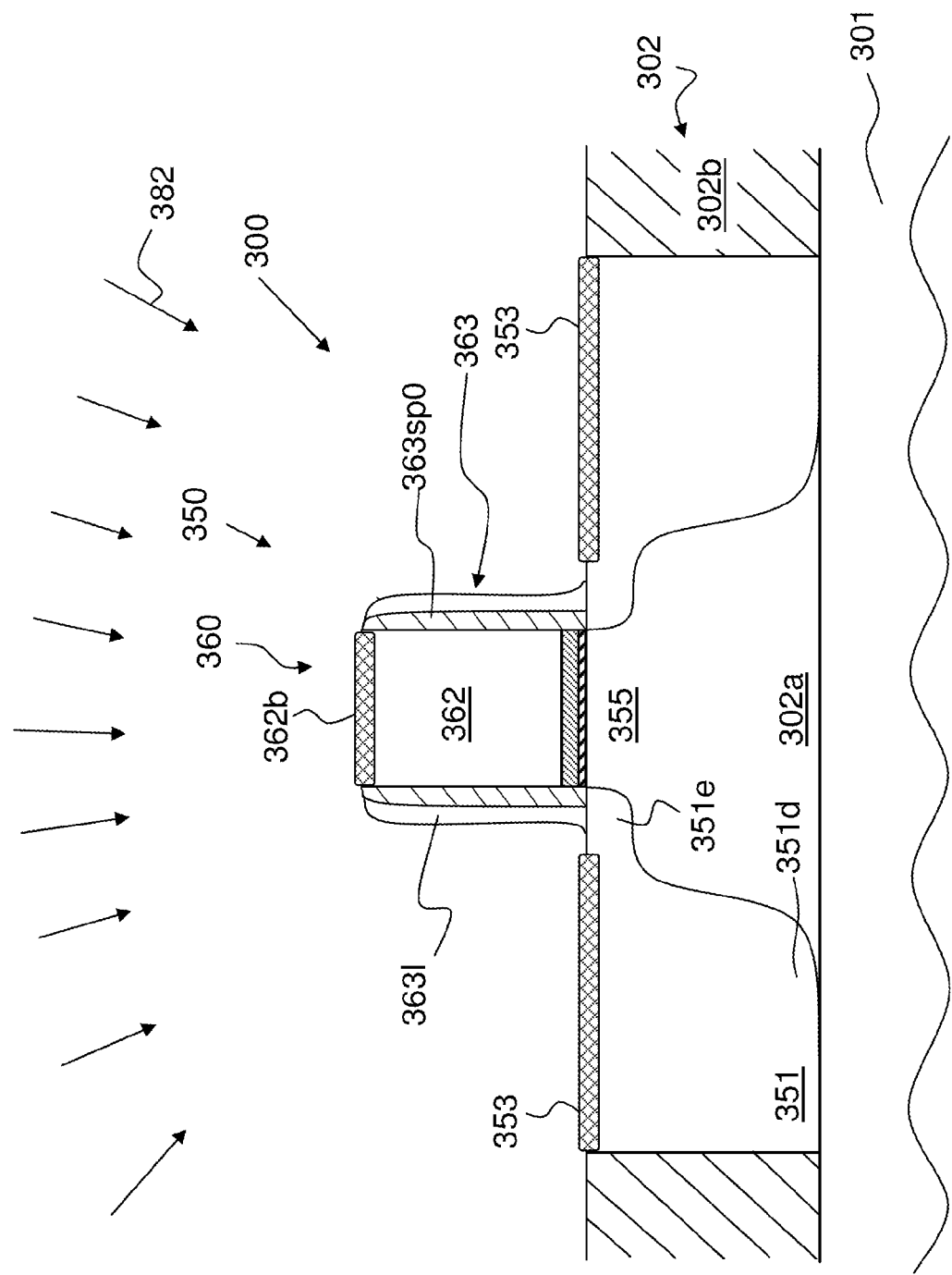

Analogously, reference numbers used in FIGS. 3a-3d substantially correspond to the reference numbers used in describing the corresponding elements illustrated in FIGS. 2a-2i except that the leading numeral has been changed from a "2" to a "3." For example, etching process "282" in FIG. 2g corresponds to etching process "382" in FIG. 3c, ion implantations "284a"-"284c" in FIG. 2h correspond to ion implantations "384a"-"384c" in FIG. 3a, respectively, etc. Accordingly, the reference number designations used to identify some elements of the presently disclosed subject matter may be illustrated in FIGS. 3a-3d but may not be specifically described in the following disclosure. In those instances, it should be understood that, unless otherwise stated, the numbered elements shown in FIGS. 3a-3d which are not described in detail below substantially correspond with their like-numbered counterparts illustrated in FIGS. 2a-2i and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor device 200 depicted in FIG. 2a, it should be understood that the gate electrode structure 260 is formed "above" the active region 202a and that the semiconductor layer 202 is "below" or "under" the insulation layer 261. Similarly, it should also be noted that the first spacer element 263sp0 of the sidewall spacer structure 263 is positioned "adjacent to" the sidewalls of the gate electrode material 262, whereas first spacer element 263sp0 may be positioned "on" the sidewalls of the gate electrode material 262 in those embodiments wherein no other layers or structures are interposed therebetween.

FIGS. 2a-2i show a semiconductor structure 200 and a method of fabrication thereof according to a first embodiment of the present invention.

FIG. 2a shows a semiconductor structure 200 during an early fabrication stage. A semiconductor layer 202 is shown, wherein an active region 202a has been created. The semiconductor structure 200 includes a transistor 250 formed partly in and partly on top of the active region 202a of the semiconductor layer 202. The transistor 250 may be an N-channel or a P-channel FET.

The semiconductor structure 200 may be formed on a substrate 201, as explained above with reference to FIGS. 1a-1d. As indicated with reference to the device 100, the substrate 201, which may represent any appropriate carrier material, and the semiconductor layer 202 may form an SOI configuration or a bulk configuration, depending on the overall process and device requirements. Furthermore, a plurality of active regions 202a may be laterally delineated by isolation regions 202b. For convenience, a single active region 202a is illustrated in FIG. 2a. In the embodiment shown, the active region 202a may correspond to the active region of a P-channel transistor or an N-channel transistor 250 to be formed in and above the active region 202a.

According to an embodiment of the present invention, the semiconductor structure 200 is manufactured according to a sub-45 nm technology. According to particular embodiments, the semiconductor structure 200 is manufactured according to the 32 nm technology or the 28 nm technology. In one embodiment, the semiconductor layer 202 comprises silicon. In a specific embodiment, the semiconductor layer 202 comprises monocrystalline silicon. The semiconductor layer 202 has an upper surface 202u defining a plane which will be henceforth intended to be parallel to a reference horizontal plane (not shown).

The gate electrode structure 260 is formed on or above the upper surface 202u of the semiconductor layer 202. The gate electrode structure 260 includes a gate electrode material 262, which could comprise silicon, for example, polycrystalline silicon. Furthermore, the gate electrode structure 260 is provided with a dielectric insulation layer 261 between the gate electrode material 262 and the channel region of the transistor in the active region 202a of the semiconductor layer 202.

As discussed above with reference to FIG. 1a, the gate electrode structure 260 may be a conventional oxide/polysilicon gate electrode. Alternatively, the gate electrode structure 260 may be formed according to a High-k Metal Gate (HKMG) configuration and, in particular, according to a gate-first HKMG technique. In this respect, according to some embodiments, the gate insulation layer 261 comprises a high-k material such as, for example, one or more high-k dielectric materials listed above or others known in the art. Furthermore, according to some embodiments, the gate electrode structure 260 may comprise a gate metal layer 262a formed on or above the insulation layer 261. The metal layer 262a may be used in order to adjust the threshold voltage of the transistor 250 to a desired level. The metal layer 262a may comprise tantalum nitride and the like, possibly in combination with a work function metal species, such as aluminum and the like.

FIG. 2a also shows that a spacer structure 263 has been formed so as to laterally delimit the gate electrode structure 260. At the fabrication stage shown in FIG. 1a, spacer structure 263 comprises a first spacer element 263sp0. The first spacer element 263sp0 may be formed directly on the sidewalls of the gate electrode material 262, so as to form an interface with the gate electrode material 262, gate metal layer 262a and insulation layer 261. Alternatively, an additional protective layer (not shown), such as a liner, may be interposed between the first spacer element 263sp0 and the gate electrode material 262, gate metal layer 262a and insulation layer 261. The first spacer element 263sp0 may be comprised of one or more dielectric materials. According to one embodiment, the first spacer element 263sp0 comprises silicon nitride or the like.

According to some embodiments, the first spacer element 263sp0 is formed by initially depositing a continuous layer having the desired thickness of the material of which the first spacer element 263sp0 is made. Any well-established deposition technique, such as e.g., PECVD, may be used for forming the layer of material of the first spacer element 263sp0. Preferably, the layer out of which the first spacer element 263sp0 is obtained is highly conformal, with a thickness substantially uniform across the whole layer. Thus, the layer may be deposited by using a highly conformal deposition technology. For example, a deposition method, such as IRad™, may be used. IRad™ is an improved CVD growth technique wherein a plasma source is incorporated in the reaction chamber of a multi-thermal CVD system. IRad™ in-situ plasma source allows chemical reactions to proceed at the lower temperatures and longer times required for advanced sub-45 nm processing. The deposited film is then patterned so as to obtain the first spacer element 263sp0.

FIG. 2b shows a semiconductor structure 200 in a subsequent fabrication stage to that shown in FIG. 2a. As shown in FIG. 2b, after forming the first spacer element 263sp0 of the spacer structure 263, extension regions 251e are created, which are highly doped regions included in the source and drain regions. Extension regions 251e define the length of the channel region 255 of the transistor 250 and may be formed by implanting doping ions of the desired species and at the desired concentration, while the gate structure 260 is used as an implantation mask. In particular, first spacer element 263sp0 may be shaped and have an appropriate thickness so that extension regions 251e may be formed so as to define a channel region 255 with the desired length and shape.

According to one embodiment, the channel region 255 of the transistor 250 has a width (i.e., dimension along the horizontal axis in the figures) less than 45 nm. According to a particular embodiment, the width of the channel region 255 is less than about 35 nm. According to a yet more particular embodiment, the width of the channel region 255 is less than about 30 nm.

FIG. 2c shows a subsequent manufacturing stage to that shown in FIG. 2b. After forming the gate structure 260 and defining the extension regions 251e, a spacer liner layer 2631 is deposited on the surface of the semiconductor structure 200. If the first spacer element 263sp0 comprises silicon nitride, the spacer liner layer 2631 may comprise silicon dioxide. Also, the spacer liner layer 1631 may be deposited by using any standard technique, such as PECVD. The spacer liner layer 1631 is preferably highly conformal.

FIG. 2d shows that a second spacer layer 263sp1 is deposited onto the liner layer 2631. The second spacer layer 263sp1 comprises a second spacer material which is typically a dielectric material. The materials of which the second spacer layer 263sp1 is comprised may include silicon nitride or silicon dioxide. The materials of which the second spacer layer 263sp1 is comprised may be partly or totally the same as the materials included in the first spacer element 263sp0.

The second spacer layer 263sp1 may be deposited by means of any known technique, such as PECVD. Analogously to the first deposited layer, the second spacer layer 263sp1 is preferably highly conformal and has a substantially uniform thickness, i.e., a thickness fluctuation of less than about 5% across the whole layer extension. Thus, also the second spacer layer 263sp1 may be deposited by using a highly conformal deposition technique, such as, e.g., IRad™. IRad™ films are preferred when the semiconductor structure 200 is manufactured according to a sub-45 nm technology, e.g., 32 nm technology or 28 nm technology. A second spacer layer 263sp1 deposited by following the IRad™ method turns out to be highly conformal, having a zero value thickness fluctuation within the accuracy of measurement instruments, such as, e.g., a TEM (Transmission Electron Microscope).

As shown in FIG. 2e, after being deposited, the liner layer 2631 and the second spacer layer 263sp1 are patterned so as to define a broadened spacer structure 263. Patterning process 281 may include a unidirectional, anisotropic etch aimed at removing those portions of the second spacer layer 263sp1 not lying in proximity of the sidewalls of the gate electrode material 262 of the gate electrode 260. Thus, some portions of the second spacer layer 263sp1 lying above the upper surface of the semiconductor layer 202 and above the exposed upper surface of the gate electrode material 262 are removed by the etching 281. The portion of the second spacer layer 263sp1 remaining after the etching step 281 will be hereinafter referred to as the second spacer element and will still be indicated by the reference number 263sp1, as shown in FIG. 2e.

After etching the second spacer layer 263sp1 as indicated above, the exposed portions of the liner layer 2631 may also be removed. For example, if the liner layer 2631 comprises silicon dioxide, the patterning process 281 may include a wet etch used to remove the exposed portions of the liner layer 2631 lying on the upper surface of the semiconductor layer 202 and on the upper surface of the gate electrode material 262 after the desired portion of the second spacer layer 263sp1 has been etched.

FIG. 2e shows the structure of the semiconductor structure 200 resulting after the patterning process 281 has been carried out. The spacer structure 263 has been broadened due to the presence of the second spacer element 263sp1. Furthermore, a portion of the liner layer 2631 remaining after the patterning 281 is interposed between the first spacer element 263sp0 and the second spacer element 263sp1.

After patterning the liner layer 2631 and the second spacer layer 263sp1 in order to form the broadened spacer structure 263, deep regions 251d of the source and drain regions 251 may be defined, as shown in FIG. 2e. For example, a further implantation step may be performed in order to implant doping species of the desired type, while using the gate electrode 260 and the spacer structure 263 as implantation masks.

The second implantation step may be followed by an annealing step, performed in order to induce re-crystallization of the semiconductor layer 202 and to activate the doping species implanted in the source and drain regions 251. A certain amount of diffusion of the doping species may likely result from the application of the annealing process, as also shown by FIG. 2e.

After defining the source and drain regions 251 as described above, a refractory metal layer (not shown) is deposited onto the surface of the semiconductor structure 200. The refractory metal layer has been described above with reference to FIGS. 1a and 1b. As said above, the refractory metal layer may comprise one metal, such as nickel, titanium, cobalt and the like. Preferably, the refractory metal layer comprises nickel. The refractory metal layer may also comprise platinum in addition to nickel, in order to guarantee formation of a homogeneous nickel monosilicide layer.

A heat treatment as described above is performed after depositing the refractory metal layer, in order to induce formation of a metal silicide layer partly in and partly on the upper surface of the active region 202a and partly in and partly on the exposed surface of the gate electrode material 262.

FIG. 2f shows the semiconductor structure 200 after the deposition of the refractory metal layer and the heat treatment have been accomplished. As a result of the heat treatment, a metal silicide layer 262b has formed partly in and partly on top of the upper surface of the gate electrode material 262, exposed before depositing the refractory metal layer. Analogously, a metal silicide layer 253 has formed partly in and partly on top of the portion of the semiconductor layer 202 exposed before depositing the refractory metal layer. According to one embodiment, metal silicide layers 262b and 253 comprise nickel silicide.

It is observed that, in general, the first spacer element 263sp0 and the second spacer element 263sp1 are likely affected by an intrinsic stress. In particular, if the first spacer element 263sp0 and the second spacer element 263sp1 comprise silicon nitride, they are affected by internal tensile stress. If the first or second spacer element 263sp0 or 263sp1 result from a deposition performed according to the IRad™ technology, the internal tensile stress may be of the order of 1 GPa. Since the spacer structure 263 is formed in close proximity to the active region 202a of the transistor 250 and, in particular, to the channel region 255, the internal stress experienced by all components making up the spacer structure 263 are readily transferred to the channel region 255. As said above, tensile stress applied to the channel region of a P-channel FET is detrimental to its performance, since mobility of holes in the channel is reduced by tensile stress.

Thus, it is desirable to reduce to a minimum the stress level experienced by the transistor channel region 255 due to the presence of the spacer structure 263.

FIG. 2g shows a step of the manufacturing method according to an embodiment, following formation of metal silicide layers 253 and 262b shown in FIG. 2f. As shown in FIG. 2g, after forming the metal silicide layers 253 and 262b, an etching process 282 is applied to the semiconductor structure 200 in order to remove a portion of the spacer structure 263. The etching process 282 may be either isotropic or anisotropic. The etching process 282 may comprise a wet etch based on a chemical composition suitable for removing the desired portion of the spacer structure 263. Alternatively, the etching process 282 may comprise a dry etch such as, for example, reactive ion etching, plasma etching, etc.

Preferably, the etching process 282 removes an internally stressed portion of the spacer structure 263. In this manner, the stress introduced by the spacer structure 263 into the channel region 255 is reduced.

According to one embodiment, a portion of the second spacer element 263sp1 is removed by means of the etching process 282. Parameters of etching 282 may be adjusted so as to remove as large as possible a stressed portion of the spacer structure 263, without damaging or eroding other parts of the semiconductor structure 200. In particular, it is desirable that metal silicide layers 253 and 262b are neither eroded nor excessively reduced in thickness as a result of the application of the etching process 282.

For example, according to one embodiment, a portion as large as possible of the second spacer element 263sp1 is removed by etching 282, while ensuring that the etch 282 does not damage the metal silicide layers 262b and 253 or other sensitive exposed portions of the semiconductor structure 200.

Thus, a residual stressed portion of the spacer structure 263 may not be removed by the etching process 282, in order to prevent other parts of the semiconductor structure 200 from being undesirably damaged. As shown in FIG. 2g, the etching process 282 may remove all of the second spacer element 263sp1 except for a residual portion indicated as 263sp1r in the figure. The residual portion 263sp1r of the second spacer element 263sp1 is likely to be situated in areas which are hard for the etching process 282 to reach. For example, residual portions 263sp1r may be situated at the base of the electrode structure 260, in areas lying close to the semiconductor layer 202.

Portions 263sp1r of the second spacer element 263sp1 not removed by etching 282 introduce an undesirable stress component into the transistor channel region 255. Furthermore, also the first spacer element 363sp0 may likely experience an undesirable internal stress. In order to relax this undesired stress, one embodiment proposes an ion implant performed after the etching 282.

FIG. 2h shows that at least one of ion implantations 284a, 284b, 284c is performed on the semiconductor structure 200 in order to relax the internal stress experienced by the spacer structure 263. For example, if residual portions 263sp1r of the second spacer element 263sp1 are present after etch 282, one or more of ion implantations 284a, 284b, 284c may be used in order to relax the internal stress in residual portions 263sp1r not removed by etch 282.

For example, if the spacer structure 263 comprises materials experiencing an internal tensile stress, such as silicon nitride, chemical species, such as xenon or germanium, may be implanted by one or more than one of the ion implantations 284a, 284b, 284c.

In general, parameters of the relax implants 284a, 284b, 284c, such as implant species, angle, energy and dose, may be adjusted in accordance with the component of the semiconductor structure 200 whose internal stress is to be relaxed.

One notable advantage of performing the relax implants 284a, 284b, 284c after etching 282 lies in the fact that the residual portion 263sp1r of the second spacer element 263sp1 to be relaxed is much thinner than the original second spacer element 263sp1. This allows one to select parameters of the relax implants 284a, 284b, 284c such that the implanted ions cannot reach functional parts of the transistor 250 which could be harmed by the impact of the implanted ions.

For example, relax implantation may be performed at a relatively low energy so that penetration depth of implanted ions is small. Thus, according to one embodiment, ion implantations 284a, 284b, 284c are performed at an energy in the range of about 0.1-100 keV. More specifically, if germanium ions are implanted, the energy of relax implantations 284a, 284b, 284c is preferably included in the range of about 0.1-30 keV. On the other hand, if xenon ions are implanted, the energy of relax implantations 284a, 284b, 284c is preferably included in the range of about 1-100 keV.

Relax implantations 284a, 284b, 284c may be advantageously performed with doses in the range of about $10^{13}$-$10^{16}$ cm$^{-2}$.

Furthermore, if the residual portion 263sp1r of the second spacer element 263sp1 is to be relaxed, the ion beam may be preferably directed to areas of the semiconductor structure 200 in which the residual portion 263sp1r is more likely to be situated. In order to achieve this purpose, the implanted ion beam may form with respect to the vertical direction at an angle ($\theta_a$, $\theta_c$) included in the range of about −90° to about 90°. The vertical direction is here identified with a direction perpendicular to the plane defined by the upper surface of the semiconductor layer 202. Preferably, the angles $\theta_a$ and $\theta_c$ formed by the ion beam of relax implants 284a and 284c, respectively, with respect to the vertical direction are in the range of about −70° to about 70°.

As shown in FIG. 2h, relax implant 284a forms with respect to the vertical direction at an angle $\theta_a$ greater than 0° and less than 90°. Preferably, angle $\theta_a$ is in the range of 0° to 70°. A typical value which may be advantageously used for angle $\theta_a$ is about 30°. On the other hand, relax implant 284c forms with respect to the vertical direction at an angle $\theta_c$ greater than −90° and less than 0°. Preferably, angle $\theta_c$ is in the range of −70° to 0°. Angle $\theta_a$ may conveniently have a value of about −30°.

FIG. 2h also shows relax implant 284b, performed by means of an ion beam substantially directed along the vertical direction. According to one embodiment, a first relax implant 284a may be performed at an angle $\theta_a$ greater than 0° and less than 90°, followed by a second relax implant 284c at an angle $\theta_c$ greater than −90° and less than 0°. Equivalently, relax implant 284c at an angle $\theta_c$ greater than −90° and less than 0° may be performed first, followed by relax implant 284a at an angle $\theta_a$ greater than 0° and less than 90°. This may be helpful when residual portions 263sp1r of the second spacer element 263sp1 lying close to the base of the gate electrode structure 260 have to be reached by the relax implant. According to another embodiment, a relax implant with an ion beam vertically directed, such as implant 284b, is performed, alone or in combination with one or more than one relax implants with a tilted ion beam, such as 284a and 284c.

For example, according to one embodiment, a relax implantation 284a is initially performed where xenon or germanium atoms are implanted at a tilt angle $\theta_a$ of about 30°. The ion beam energy is chosen in the range of 1-100 keV and of 0.1-30 keV in the case of implantation of xenon and germanium, respectively. The implantation dose is preferably in the range of about $10^{13}$-$10^{16}$ cm$^{-2}$. Relax implantation 284a is then followed by a relax implantation 284c, wherein the same species as in previous relax implantation 284a is implanted at a tilt angle $\theta_c$ of about −30° and at similar energies and doses as for previous relax implant 284a. According to an alternative embodiment, the order of the two relax implantations is inverted and relax implantation 284c is performed before relax implantation 284a.

According to a particular embodiment, a third xenon relax implantation 284b is performed, besides tilted ion implantations 284a and 284c, with vertical, non-tilted ion beams and with an energy and a dose in the same ranges as given above. Relax implantation 284b may be alternatively performed before implantations 284a and 284c, after implantations 284a and 284c, and between implantations 284a and 284c. According to a further embodiment, only relax implantations 284a and 284b may be performed, in the desired order, without performing relax implantations 284c. According to yet another embodiment, only relax implantations 284b and 284c may be performed, in the desired order, without performing relax implantations 284a.

It is observed that relax implants 284a, 284b, 284c may be used also to relax the stress experienced by the first spacer component 263sp0. In this case, appropriate implantation parameters have to be set. For example, the ion beam may be selected to be substantially parallel to the vertical direction, as in implantation 284b. Furthermore, the implantation energy may be increased to an appropriate level with respect to the relax implant performed in order to relax the residual portion 263sp1r of the second spacer element 263sp1.

In general, any stressed material limiting or hindering device performance may be addressed during the manufacturing step shown in FIG. 2h by means of relax implants 284a, 284b, 284c. Obviously, implant parameters have to be adjusted based on the type of the stress to be relaxed and on the addressed material.

According to one embodiment, a mask, such as, for example, a lithographic mask, may be used when performing relax implants 284a-284c in order to prevent implanted ions to reach undesired areas of the semiconductor structure 200.

According to one embodiment, the semiconductor structure 200 comprises one or a plurality of N-channel transistors and one or a plurality of P-channel transistors. Then, a lithographic mask may be used so as to screen areas of the semiconductor structure 200 corresponding to N-channel transistors and leaving areas of the semiconductor structure 200 corresponding to N-channel transistors exposed during relax implants 284a-284c aimed at relaxing tensile stress in spacer 263 or in other components of the semiconductor structure 200. Vice versa, if relax implants 284a-284c are performed in order to relax internal compressive stress in spacer 263 or in other components of the semiconductor structure 200, then a lithographic mask may be used which screens areas of the semiconductor structure 200 corresponding to P-channel transistors and leaves exposed areas of the semiconductor structure 200 corresponding to P-channel transistors.

Therefore, thanks to the present invention, relaxation of the intrinsic stress of the spacer structure 263 may be achieved to a particularly satisfactory extent. In particular, according to the present invention, stress relaxation of the spacer structure 263 may be obtained more effectively after the second spacer component 263sp1 has been formed. This is in contrast to the case in which stress relaxation is performed straight after deposition of the dielectric layer out of which the second spacer component 263sp1 is obtained, such as, for example, after the fabrication stage shown in FIG. 2d.

Indeed, according to the present disclosure, relaxation is more effective since it is performed on the actual element to be relaxed. Furthermore, unintended interactions of the relax implanted species with non-stressed elements of the semiconductor structure may be prevented from occurring by means of the claimed method. A further advantage of the method according to the present invention is that spacer material properties are not adversely affected by the relax implant. In particular, the relax implant does not cause defects or damages in the spacer materials which may result in device failures when etching portions of the spacer or when patterning dielectric layers in order to form the spacer structure.

Figure 1D:
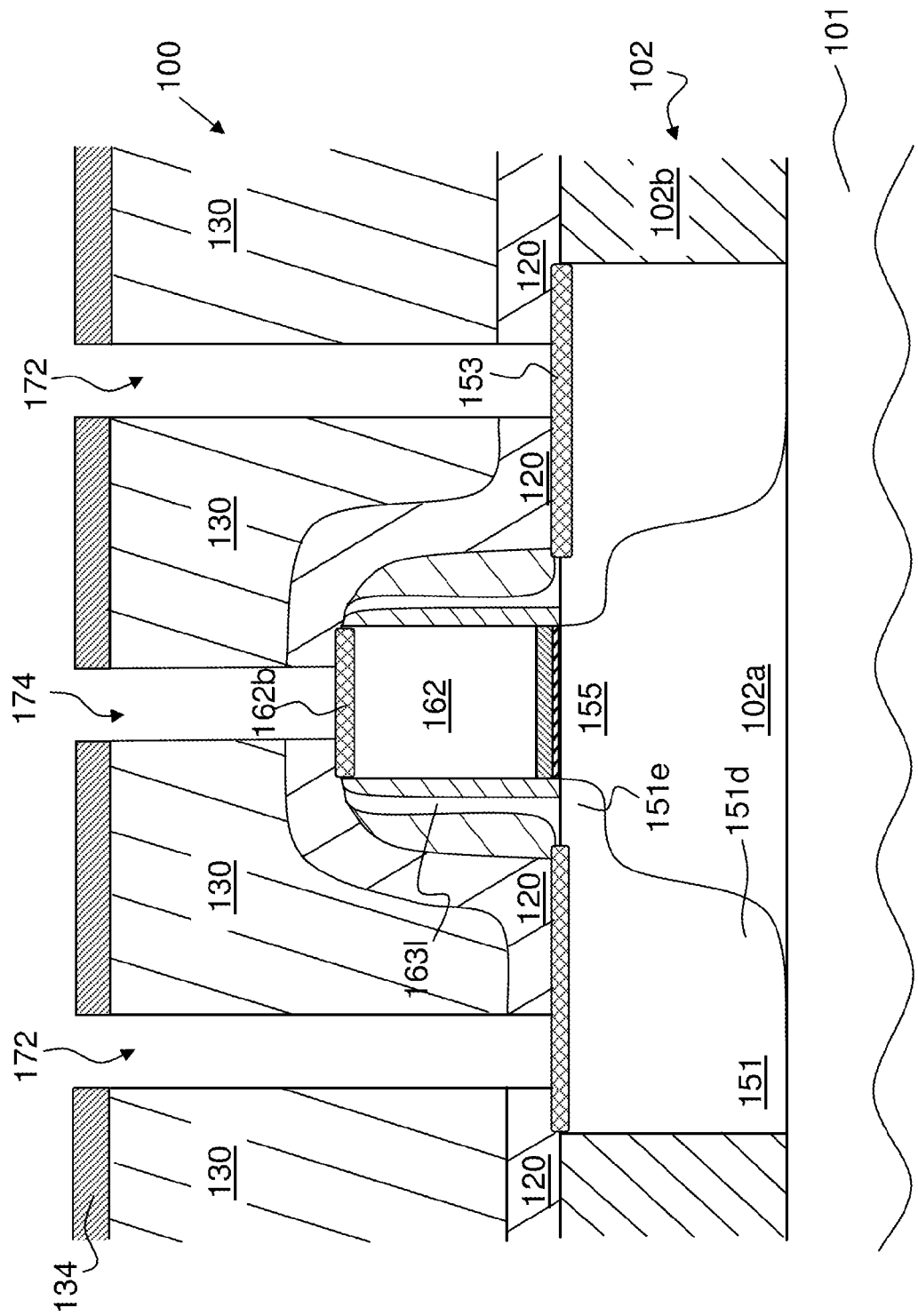

FIG. 2i shows the semiconductor structure 200 in an advanced fabrication stage of the method according to one embodiment. The fabrication stage shown in FIG. 2i substantially corresponds to the fabrication method according to the state of the art shown in FIG. 1d.

A stressed material layer 220 has been deposited on the surface of the transistor structure 250, as described with reference to FIG. 1d. Still with reference to FIG. 2i, the stressed material layer 220 may comprise two or more internally stressed layers, possibly separated by intermediate liner layers, as previously clarified. For example, the stressed material layer 220 may be the result of a deposition method according to the dual-stress-liner approach. An interlayer dielectric material layer 230 has then been deposited on the stressed material layer 220, again as previously described. Thereafter, an etching process such as reactive ion etching (RIE), is performed on the semiconductor structure 200 in order to open via openings 272 and 274 exposing portions of metal silicide layers 253 and 262b, respectively.

Thus, the method according to the embodiment of the present invention described above results in a transistor 250 included in a semiconductor structure 200 having a much lower degree of stress in the channel region as compared to analogous devices known from the state of the art. Therefore, the claimed method enables manufacturing transistors with improved performances compared to known devices.

FIGS. 3a-3d schematically show a second embodiment of the present invention. FIG. 3a shows a semiconductor structure 300 including a transistor 350 during a fabrication stage corresponding to that shown in FIG. 2e. With reference to FIG. 3a, a layer of dielectric material as discussed above with reference to FIG. 2d has been deposited and patterned in order to form the second spacer element 363sp1. Thereafter, the exposed portions of the liner layer 3631 may also be removed, so as to obtain the final broadened spacer structure 363 shown in FIG. 3a. After the spacer structure 363 has been broadened with the second spacer element 363sp1, deep regions 351d may be formed, e.g., by ion implantation, which completes formation of source and drain regions 351. After all doping species have been appropriately introduced in the source and drain regions 351, an activation annealing is performed in order to re-crystallize implantation damage and activate the doping ions, as discussed above with reference to FIG. 2e.

According to the embodiment herewith described, at least one of the relax implants 384a-384c shown in FIG. 3a may be performed after the activation annealing in order to relax the internal stress experienced by the spacer structure 363. It is observed that, according to this embodiment, no other manufacturing step is preferably carried out between the activation annealing and relax implants 384a-384c. Thus, according to the embodiment being discussed, relax implants 384a-384c are performed after the broadened spacer structure 363 has been formed and, preferably, after the activation annealing has been performed.

Relax implants 384a-384c are analogous to relax implants 284a-284c, respectively, described with reference to FIG. 2h. Unless otherwise stated, what has been described in relation to relax implants 284a-284c may be applied to relax implants 384a-384c. Parameters of relax implants 384a-384c may be adjusted based on the material and the type of internal stress to be relaxed. For example, relax implants 384a-384c may, analogously to relax implants 284a-284c, be performed in the energy range of about 1-100 keV for xenon implantation and of about 0.1-30 keV for germanium implantation.

Relax implants 384a-384c may advantageously be performed at a higher ion beam energy than relax implants 284a-284c described with reference to the previous embodiment. This is due to the fact that the thickness of the first spacer element 363sp1 which is desirable to be relaxed according to the embodiment being discussed is thicker than the portion 263sp1r of the first spacer element 263sp1 remaining after etch 282 and to be relaxed according to the previous embodiment described above. Thus, relax implantation 384a-384c according to one embodiment is performed within the range of about 1-30 keV in the case of germanium implantation.

Furthermore, relax implants 384a-384c may preferably be performed with the ion beam aligned with the vertical direction, as shown by relax implant 384b in FIG. 3a. By "vertical direction" a direction is here indicated normal to the horizontal plane defined by the surface of semiconductor layer 302. In this manner, the penetration depth of the implanted species into the semiconductor layer 302 and the spacer structure 363 is enhanced with respect to ion implantations performed with an ion beam tilted with respect to the vertical direction.

According to an advantageous embodiment, relax implants 384a-384c comprise implanting germanium ions. Germanium is able to relax tensile stress in dielectric materials such as silicon nitride. Furthermore, when implanted in a semiconductor layer 302 made of crystalline silicon, germanium is known to result in an amorphous silicon layer, indicated in FIG. 3a by the reference number 306. It is a known fact that, when forming the metal silicide layer described above, silicidation is improved when occurring in and on top of an amorphous silicon layer, such as layer 306. Thus, by means of a single implant process 384a-384c, a double advantageous effect can be achieved: stress relaxation and improvement of the quality of the metal silicide layer.

As shown in FIG. 3b, according to the embodiment being discussed, the device manufacturing method continues with a silicidation step, similar to that described above with reference to FIGS. 1b and 2f. With reference to FIG. 3b, a refractory metal layer, typically nickel, is deposited onto the surface of the semiconductor structure 300, followed by an annealing step resulting in formation of the metal silicide layers 353 in and on top of the active region 302a of the semiconductor layer 302 and the metal silicide layer 362a in and on top of the gate electrode material 362. Metal silicide layers 353 and 362a preferably comprise nickel silicide.

According to this embodiment, silicidation is performed after relax implants 384a-384c shown in FIG. 3a. Thus, if germanium ions have been implanted with relax implants 384a-384c, the amorphous silicon layer 306 in the active region 302a promotes formation of a metal silicide layer 353 with improved quality, thereby enabling a particularly effective contact to the source and drain regions 351 of the transistor 350.

FIG. 3c shows that, after the silicidation process has been completed, an etching process 382 may be performed in order to remove a portion of the spacer structure 363, analogously to etching process 282 described with reference to FIG. 2g. The etching process 382 may be performed in order to further reduce the internal stress level experienced by the spacer structure 363 and in order to reduce the lateral size of the gate electrode 360.

FIG. 3c shows the semiconductor structure 300 resulting after application of the etching process 382 according to one embodiment. According to this embodiment, the etching process 382 removes a portion of the second spacer element 363sp1. The second spacer element 363sp1 may be removed entirely or only partially by the etching process 382. Since relax implantations 384a-384c have been performed before carrying out the etching process 382, the spacer structure 363 is affected by a reduced level of internal stress. Thus, parameters of the etching process 382 may be adjusted so as to reduce the strength of the etching process 382 to a minimum. In particular, according to some embodiments, the etching process 382 may be omitted altogether.

Figure 3D:
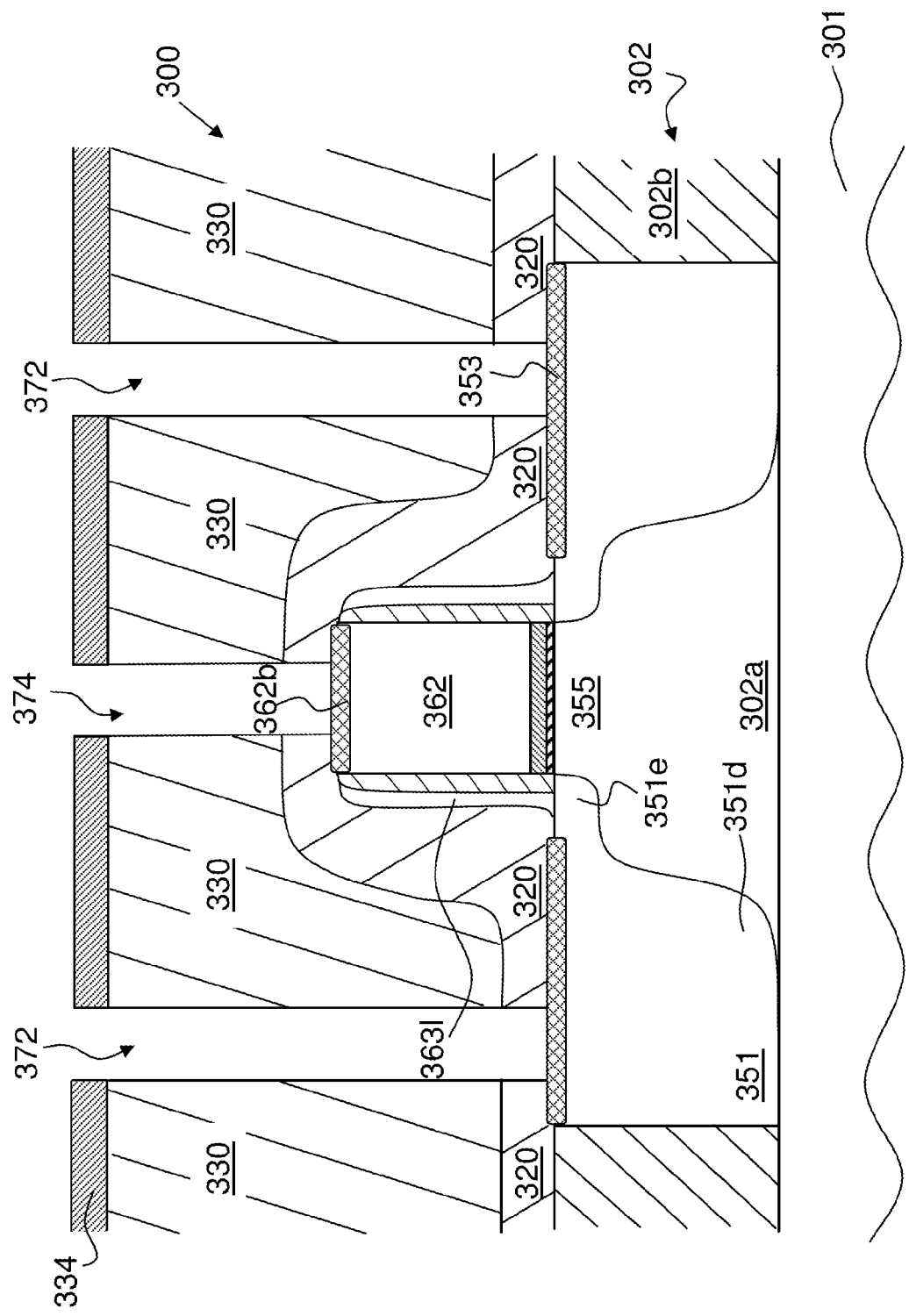

After forming metal silicide layers 353 and 362a and, where so required, after performing the etching process 382, a stressed material layer 320 is deposited on the surface of the semiconductor structure 300, as shown in FIG. 3d. Also shown in FIG. 3d is a dielectric layer 330, which may comprise an interlayer dielectric such as silicon dioxide. Via openings 372 and 374 are then formed in the stressed material layer 320 and in the dielectric layer 330 in order to expose portions of the metal silicide layers 353 and 362b, respectively. The exposed portions of the metal silicide layers 353 and 362b may then be used in order to provide an electrical connection to the source and drain regions 351 and to the gate electrode material 362b, respectively. It is observed that the configuration of the semiconductor structure 300 shown in FIG. 3d substantially corresponds to that of the semiconductor structure 200 shown in FIG. 2i.

The present invention provides an easy and effective method of relaxing the stress experienced by a spacer structure formed on the sidewalls of a transistor gate electrode. The method according to the present invention uses a relax implant performed after the spacer structure has been fully formed, in particular after a first stressed spacer element lying on or above the gate electrode material and a second stressed spacer element lying on or above the first spacer element have been produced in their final form. Advantageously, when fabricating a transistor, the relax implant is performed after all doping ion implantations have been performed in order to form and define the source and drain regions and after an activation annealing has been carried out in order to allow the crystalline structure to reform after implantation damage and to activate the implanted doping ions.

The claimed methods may be advantageously used when relaxing stress of spacer stress elements obtained after patterning dielectric layers deposited by using a deposition technique, such as IRad™, resulting in highly conformal films which may experience a certain degree of internal stress. In this respect, the present invention finds an advantageous application in sub-45 nm semiconductor fabrication technologies, e.g., 32 nm technology, 28 nm technology and beyond, wherein it is crucial to deposit highly conformal dielectric films to be patterned so as to obtain spacer structures. However, the present application is not restricted to sub-45 nm technologies, but may be applied to all semiconductor fabrication methods. In particular, the present invention may be used for relaxing the internal stress undesirably present in any component of a semiconductor device in a manufacturing stage subsequent to spacer formation and ion implantation performed so as to define the source and drain regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor structure comprising:
forming a gate structure above an active region of a semiconductor layer;
forming a first spacer element on the sidewalls of said gate structure, said first spacer element having an internal stress;
forming an intermediate spacer layer on said first spacer element;
forming a second spacer element on said intermediate spacer element, said second spacer element having an internal stress;
forming a metal silicide layer that has an interface with said semiconductor layer;
removing a portion of said second spacer element after forming said metal silicide layer, wherein said second spacer element is only partially removed so as to leave a residual portion of said second spacer element; and
performing an ion implantation in order to relax the internal stress in said residual portion of said second spacer element and said first spacer element.

2. The method of claim 1, wherein said step of performing an ion implantation comprises implanting ions of xenon or germanium.

3. The method of claim 1, wherein said ion implantation is performed at an energy in the range of 0.1-100 keV.

4. The method of claim 1, wherein said semiconductor layer comprises an outer surface above which said gate structure is formed and wherein said ion implantation is performed so that the ion beam is tilted with respect to the normal to said outer surface of said semiconductor layer.

5. The method of claim 4, wherein said implantation comprises a first implantation followed by a second implantation and wherein at least one of the first or the second implantation is performed using a tilted ion beam.

6. A method of forming a transistor structure comprising:
forming a gate structure above an active region of a semiconductor layer;
forming a first spacer element on the sidewalls of said gate structure, said first spacer element having an internal stress;
forming an intermediate spacer layer on said first spacer element;
forming a second spacer element on said intermediate spacer element, said second spacer element having an internal stress;
forming a metal silicide layer that has an interface with said semiconductor layer;
removing a portion of said second spacer element after forming said metal silicide layer, wherein said second spacer element is only partially removed so as to leave a residual portion of said second spacer element; and
performing an ion implantation using ions of xenon or germanium in order to relax the internal stress in said residual portion of said second spacer element and said first spacer element, wherein said semiconductor layer comprises an outer surface above which said gate structure is formed and wherein said ion implantation is performed so that an ion beam is tilted with respect to the normal to said outer surface of said semiconductor layer.

7. The method of claim 6, wherein said ion implantation is performed at an energy in the range of 0.1-100 keV.

8. The method of claim 6, wherein said ion implantation comprises a first implantation followed by a second implantation and wherein at least one of said first or said second implantation is performed using a tilted ion beam.